(12) United States Patent
Sekar et al.

(10) Patent No.: US 7,525,843 B2
(45) Date of Patent: *Apr. 28, 2009

(54) NON-VOLATILE STORAGE WITH ADAPTIVE BODY BIAS

(75) Inventors: Deepak Chandra Sekar, Mountain View, CA (US); Nima Mokhlesi, Los Gatos, CA (US)

(73) Assignee: SanDisk Corporation, Milpitas, CA (US)

( * ) Notice: Subject to any disclaimer, the term of this patent is extended or adjusted under 35 U.S.C. 154(b) by 80 days.

This patent is subject to a terminal disclaimer.

(21) Appl. No.: 11/618,793

(22) Filed: Dec. 30, 2006

(65) Prior Publication Data

US 2008/0158992 A1   Jul. 3, 2008

(51) Int. Cl.
*G11C 16/00* (2006.01)
(52) U.S. Cl. .................. 365/185.18; 365/185.09; 365/185.27
(58) Field of Classification Search ............ 365/185.27, 365/201, 185.04
See application file for complete search history.

(56) References Cited

U.S. PATENT DOCUMENTS

| | | | |
|---|---|---|---|
| 5,386,422 A | 1/1995 | Endoh |
| 5,467,306 A | 11/1995 | Kaya |
| 5,522,580 A | 6/1996 | Varner, Jr. |
| 5,570,315 A | 10/1996 | Tanaka |
| 5,589,699 A | 12/1996 | Araki |
| 5,659,505 A | 8/1997 | Kobayashi |
| 5,745,417 A | 4/1998 | Kobayashi |
| 5,774,397 A | 6/1998 | Endoh |
| 5,831,903 A | 11/1998 | Ohuchi |
| 5,982,663 A | 11/1999 | Park |
| 6,009,014 A | 12/1999 | Hollmer |
| 6,046,935 A | 4/2000 | Takeuchi |
| 6,058,045 A | 5/2000 | Pourkeramati |

(Continued)

FOREIGN PATENT DOCUMENTS

JP     411045986     2/1999

(Continued)

OTHER PUBLICATIONS

N. Shibata et al., A 70nm 16Gb 16-level-cell NAND Flash Memory, 2007 Symp. on VLSI Circuits Digest of Technical Papers, pp. 190-191, Jun. 14-16, 2007.

(Continued)

*Primary Examiner*—Tan T. Nguyen
(74) *Attorney, Agent, or Firm*—Vierra Magen Marcus & DeNiro LLP

(57) ABSTRACT

A non-volatile storage system in which body bias can be applied to optimize performance. Body bias can be set in an adaptive manner to reduce an error count of an error correcting and/or detecting code when reading data from non-volatile storage elements. Also, a body bias level can be increased as a number of programming cycles increases. Also, body bias levels can be set and applied separately for a chip, plane, block and/or page. A body bias can be applied to a first set of NAND strings for which operations are being performed by controlling a first voltage provided to a source side of the first set of NAND strings and a second voltage provided to a p-well. A source side of a second set of NAND strings for which operations are not being performed is floated or receives a fixed voltage.

26 Claims, 25 Drawing Sheets

U.S. PATENT DOCUMENTS

| | | |
|---|---|---|
| 6,175,522 B1 | 1/2001 | Fang |
| 6,218,895 B1 | 4/2001 | De |
| 6,222,762 B1 | 4/2001 | Guterman |
| 6,272,666 B1 | 8/2001 | Borkar |
| 6,301,155 B1 | 10/2001 | Fujiwara |
| 6,363,016 B1 | 3/2002 | Lin |
| 6,366,499 B1 | 4/2002 | Wang |
| 6,456,528 B1 | 9/2002 | Chen |
| 6,484,265 B2 | 11/2002 | Borkar |
| 6,522,580 B2 | 2/2003 | Chen |
| 6,529,410 B1 | 3/2003 | Han |
| 6,560,152 B1 | 5/2003 | Cernea |
| 6,577,530 B2 | 6/2003 | Muranaka |
| 6,734,490 B2 | 5/2004 | Esseni |
| 6,751,125 B2 | 6/2004 | Prinz |
| 6,771,536 B2 | 8/2004 | Li |
| 6,801,454 B2 | 10/2004 | Wang |
| 6,839,281 B2 | 1/2005 | Chen |
| 6,859,397 B2 | 2/2005 | Lutze |
| 6,870,213 B2 | 3/2005 | Cai |
| 6,900,650 B1 | 5/2005 | Sheng |
| 6,917,237 B1 | 7/2005 | Tschanz |
| 6,957,163 B2 | 10/2005 | Ando |
| 7,009,881 B2 | 3/2006 | Noguchi |
| 7,046,568 B2 | 5/2006 | Cernea |
| 7,057,958 B2 | 6/2006 | So |
| 7,116,588 B2 | 10/2006 | Joo |
| 7,170,785 B2 | 1/2007 | Yeh |
| 7,196,928 B2 | 3/2007 | Chen |
| 7,209,386 B2 | 4/2007 | Yeh |
| 7,244,976 B2 | 7/2007 | Cai |
| 7,292,476 B2 | 11/2007 | Goda |
| 7,345,913 B2 | 3/2008 | Isobe |
| 7,394,708 B1 * | 7/2008 | Vadi ............................ 365/201 |
| 2002/0140496 A1 | 10/2002 | Keshavarzi |
| 2004/0057287 A1 | 3/2004 | Cernea |
| 2004/0109357 A1 | 6/2004 | Cernea |
| 2004/0255090 A1 | 12/2004 | Guterman |
| 2005/0024939 A1 | 2/2005 | Chen |
| 2005/0052219 A1 | 3/2005 | Butler |
| 2005/0111260 A1 | 5/2005 | Nazarian |
| 2005/0192773 A1 | 9/2005 | Sheng |
| 2006/0126390 A1 | 6/2006 | Gorobets |
| 2006/0133172 A1 | 6/2006 | Schnabel |
| 2006/0140007 A1 | 6/2006 | Cernea |
| 2006/0158947 A1 | 7/2006 | Chan |
| 2006/0226889 A1 | 10/2006 | Gupta |
| 2006/0227613 A1 | 10/2006 | Joo |
| 2007/0008779 A1 | 1/2007 | Isobe |

FOREIGN PATENT DOCUMENTS

| | | |
|---|---|---|
| JP | 411250681 | 9/1999 |

OTHER PUBLICATIONS

Y. Zhang et al., An Integrated Phase Change Memory Cell With Ge Nanowire Diode For Cross-Point Memory, 2007 Symp. on VLSI Circuits Digest of Technical Papers, pp. 98-99, Jun. 14-16, 2007.

D.H. Kang et al., Novel Heat Dissipating Cell Scheme For Improving A Reset Distribution In A 512M Phase-Change Random Access Memory (PRAM), 2007 Symp. on VLSI Circuits Digest of Technical Papers, pp. 96-97, Jun. 14-16, 2007.

H. Tanaka et al., Bit Cost Scalable Technology With Punch And Plug Process For Ultra High Density Flash Memory, 2007 Symp. on VLSI Circuits Digest of Technical Papers, pp. 14-15, Jun. 14-16, 2007.

U.S. Appl. No. 11/618,791, filed Dec. 30, 2006.

Office Action dated Jul. 22, 2008, U.S. Appl. No. 11/681,782, filed Dec. 30, 2006.

Office Action dated Jun. 24, 2008, U.S. Appl. No. 11/681,786, filed Dec. 30, 2006.

Office Action dated Jun. 9, 2008, U.S. Appl. No. 11/618,788, filed Dec. 30, 2006.

Office Action dated Jun. 9, 2008, U.S. Appl. No. 11/618,790, filed Dec. 30, 2006.

Office Action dated Jul. 25, 2008, U.S. Appl. No. 11/618,791, filed Dec. 30, 2006.

Office Action dated Jan. 6, 2009, U.S. Appl. No. 11/618,786, filed Dec. 30, 2006.

Office Action dated Feb. 10, 2009, U.S. Appl. No. 11/618,782, filed Dec. 30, 2006.

* cited by examiner

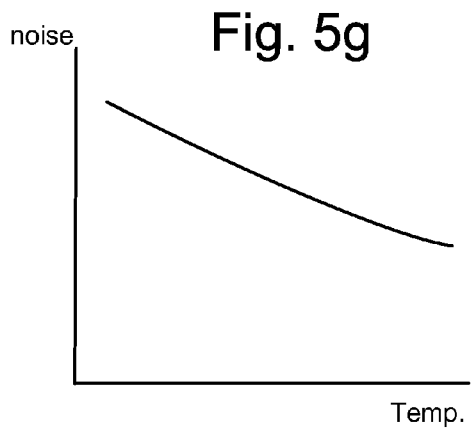
Fig. 5g
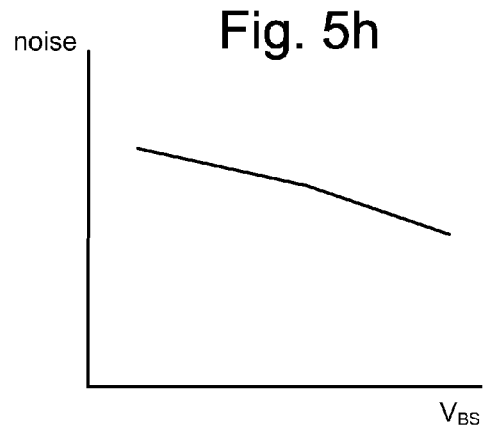
Fig. 5h
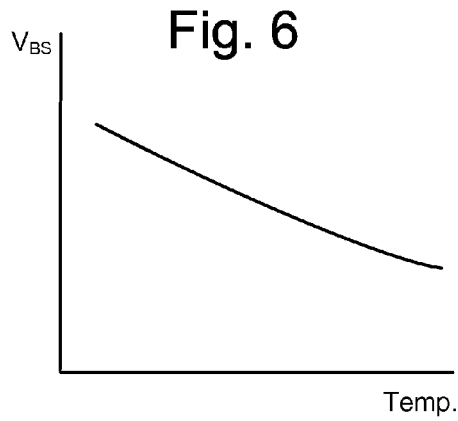
Fig. 6
Fig. 7
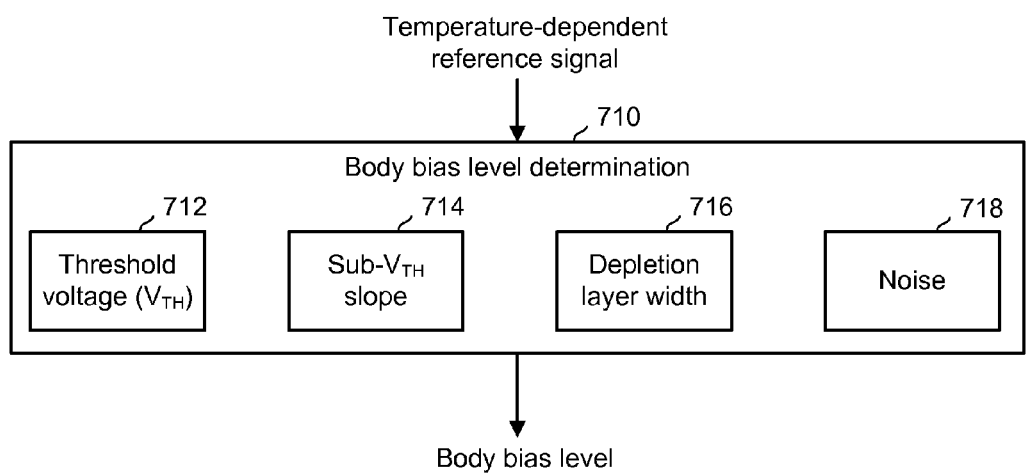

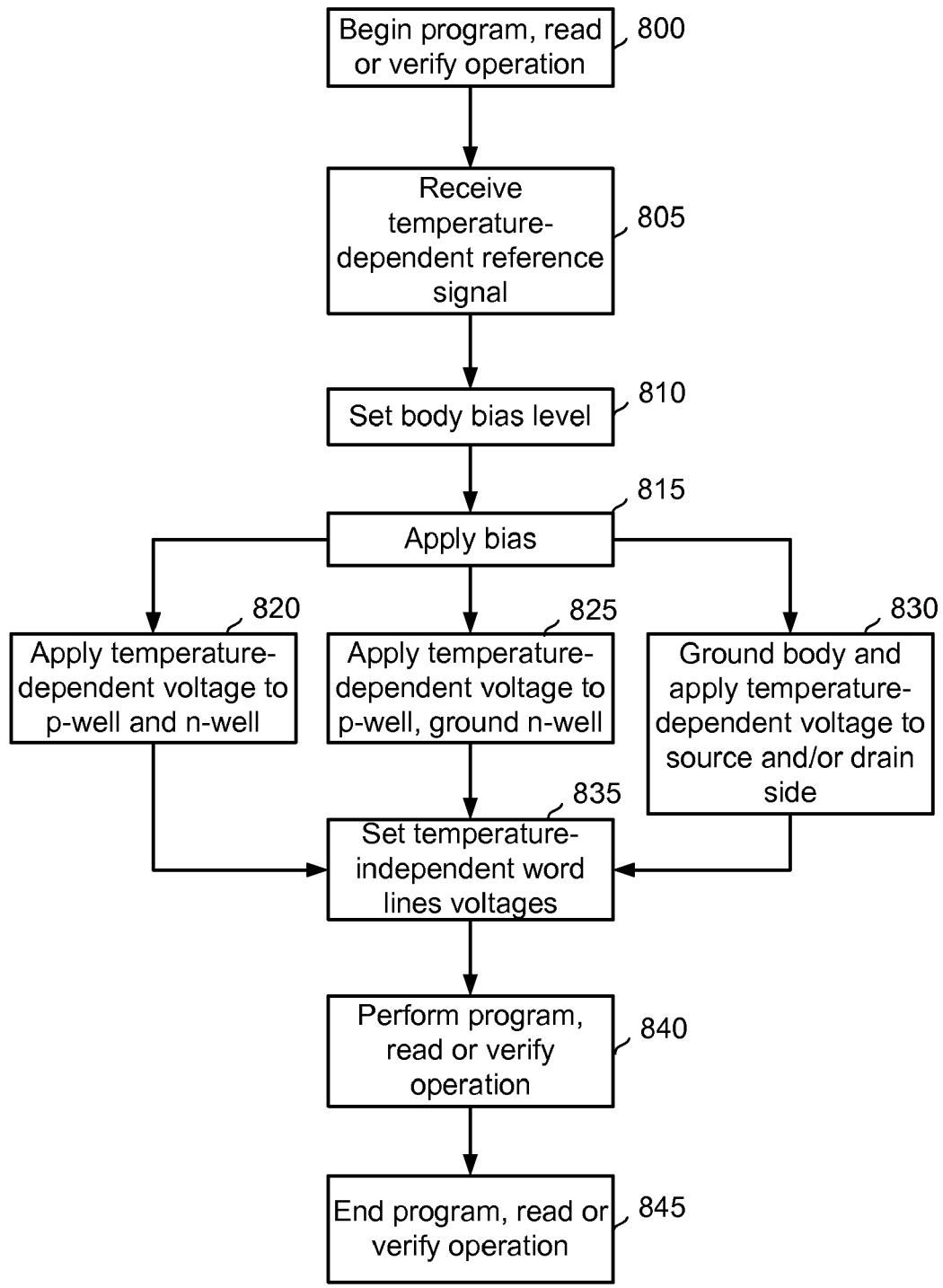

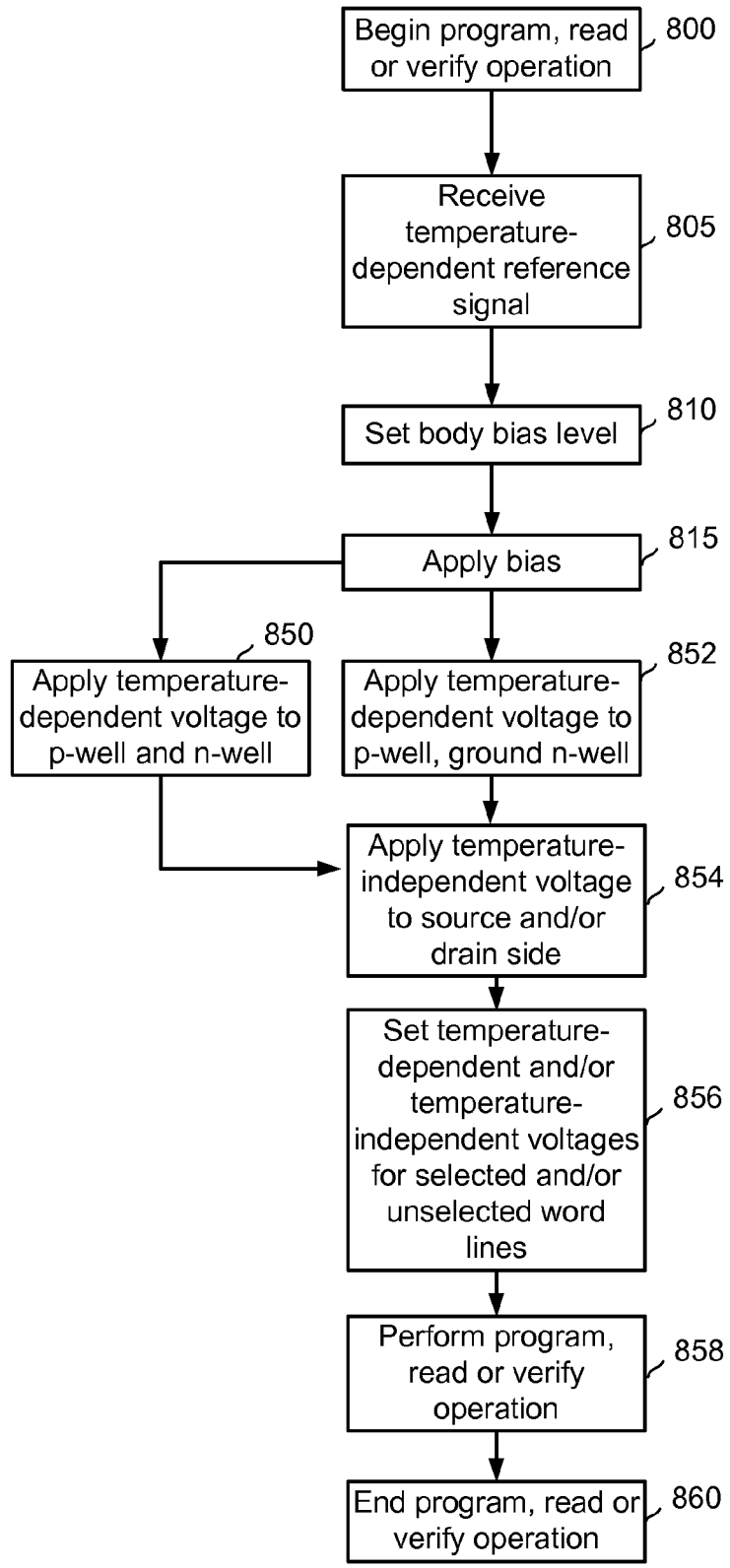

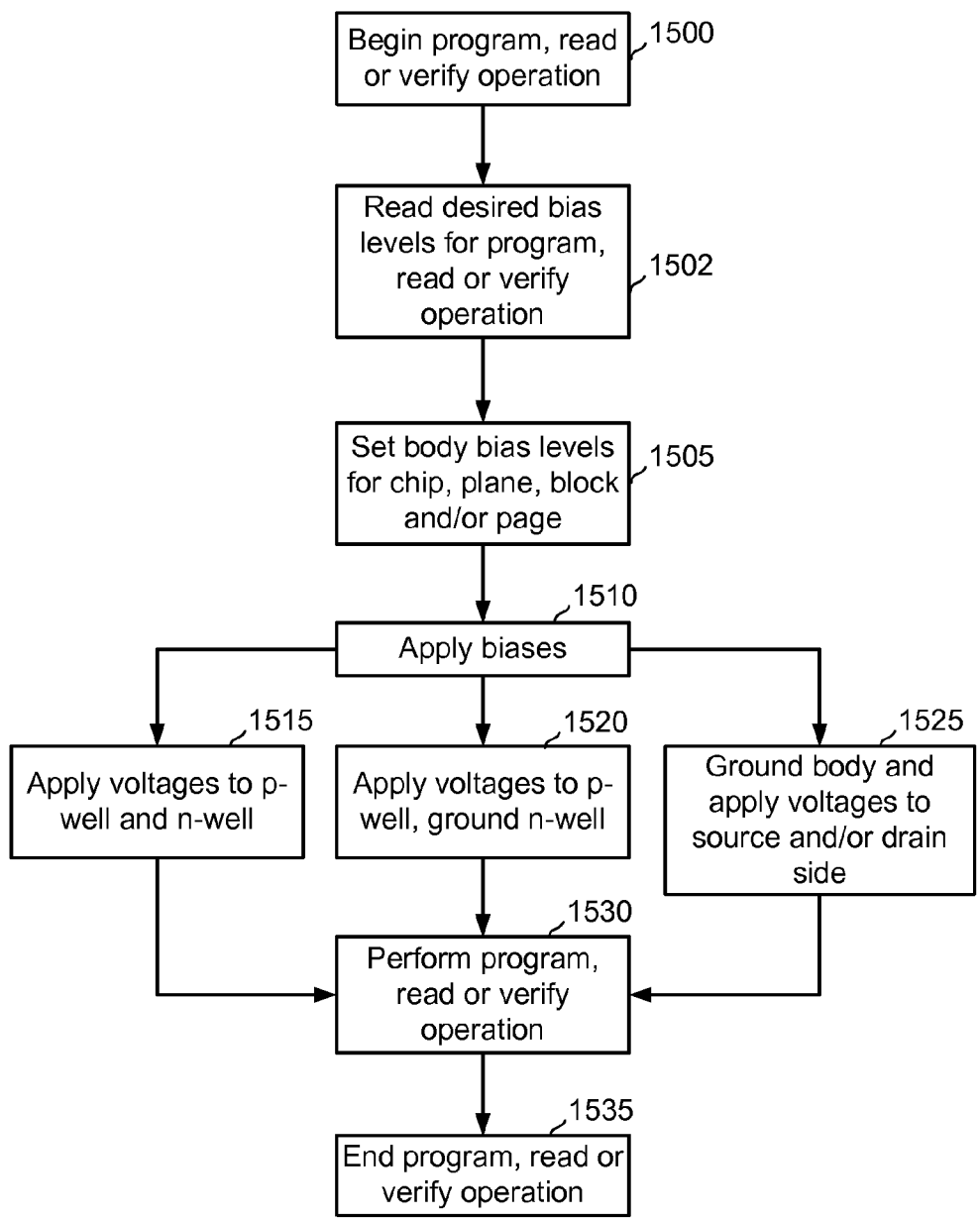

NON-VOLATILE STORAGE WITH ADAPTIVE BODY BIAS

CROSS-REFERENCE TO RELATED APPLICATIONS

This application is related to, commonly assigned U.S. patent application Ser. No. 11/618,782, filed Dec. 30, 2006 (and published on Jun. 30, 2006 as US2008/0158970), titled "Biasing Non-Volatile Storage To Compensate For Temperature Variations", U.S. patent application Ser. No. 11/618,786, filed Dec. 30, 2006 (and published on Jul. 3, 2006 as US2008/0158975), titled "Non-Volatile Storage With Bias For Temperature Compensation", U.S. patent application Ser. No. 11/618,788, filed Dec. 30, 2006 (and published Jun. 30 2006 as US2008/0158976), titled "Biasing Non-Volatile Storage Based On Selected Word Line", U.S. patent application Ser. No. 11/618,790, filed Dec. 30, 2006 (and published on Jun. 30, 2006 as US2008/0159007), titled "Non-Volatile Storage With Bias Based On Selected Word Line", and U.S. patent application Ser. No. 11/618,791, filed Dec. 30, 2006 (and published on Jul. 3, 2006 as US2008/0158960), titled "Applying Adaptive Body Bias To Non-Volatile Storage", each of which is incorporated herein by reference.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," published Feb. 3, 2005; both of which are incorporated herein by reference in their entirety.

However, techniques for optimizing performance of a non-volatile storage system are needed.

SUMMARY OF THE INVENTION

The present invention addresses the above and other issues by providing a non-volatile storage system in which a body bias is applied to optimize performance.

In one embodiment, a non-volatile storage system includes at least one set of non-volatile storage elements formed, at least in part, on a substrate, and one or more control circuits in communication with the at least one set of non-volatile storage elements. The one or more control circuits read non-volatile storage elements in the at least one set of non-volatile storage elements while biasing a substrate at a first bias level, and, based on the read, determine a first error metric. If the first error metric exceeds a threshold, the one or more control circuits determine a second bias level for biasing the substrate when performing a subsequent read of non-volatile storage elements in the at least one set of non-volatile storage elements. The first error metric can include a count of bit errors.

The one or more control circuits can further read non-volatile storage elements in the at least one set of non-volatile storage elements while biasing the substrate at the second bias level, and determine a second error metric, based on the reading while biasing the substrate at the second bias level. If the second error metric exceeds the threshold, a third bias level is determined for biasing the substrate when performing a subsequent read of non-volatile storage elements in the at least one set of non-volatile storage elements. When the second bias level is lower than the first bias level, the third bias level can be higher than the first bias level if the second error metric indicates more errors than the first error metric. When the second bias level is higher than the first bias level, the third bias level can be lower than the first bias level if the second error metric indicates more errors than the first error metric.

In one approach, if the first error metric does not exceed the threshold, the substrate is biased at the first bias level when performing a subsequent read of non-volatile storage elements in the at least one set of non-volatile storage elements.

The first error metric can be determined based on reading non-volatile storage elements in a number of sets of non-volatile storage elements which are formed, at least in part, on the substrate, where the first error metric is determined based on error metrics which are determined for each of the sets. In another approach, the first error metric is determined based on multiple read operations performed on non-volatile storage elements in the at least one set of non-volatile storage elements. The at least one set of non-volatile storage elements can be provided in at least one NAND string which is formed, at least in part, on the substrate.

In one approach, the biasing includes applying a voltage based on the first bias level to the substrate. In another approach, the biasing can include applying a first voltage to the substrate, and applying a second voltage to at least one of a source side and a drain side of the set of non-volatile storage elements, where a difference between the first and second voltages is based on the first bias level.

The first error metric can be for a page of data stored by the at least one set of non-volatile storage elements.

In another embodiment, a non-volatile storage system includes at least one set of non-volatile storage elements formed, at least in part, on a substrate, and one or more control circuits in communication with the at least one set of non-volatile storage elements. The one or more control circuits track programming cycles experienced by the at least one set of non-volatile storage elements, and bias the substrate at a bias level during operations performed on the at least one set of non-volatile storage elements, where the bias level is based on the tracking. For example, the operations can include programming, reading and/or verifying.

In one approach, the bias level increases as a number of the programming cycles increases.

The tracking can include separately tracking programming cycles experienced by different sets of non-volatile storage elements which are formed, at least in part, on different portions of the substrate. In this case, an aggregate usage metric is determined based on the separate tracking, and the bias level is based on the aggregate usage metric.

In another approach, the tracking includes separately tracking programming cycles experienced by different sets of non-volatile storage elements which are formed, at least in part, on different portions of the substrate. In this case, the biasing includes biasing the different portions of the substrate at different bias levels during operations performed on the different sets of non-volatile storage elements, where the different bias levels are based on the tracking.

In another embodiment, a non-volatile storage system includes different sets of non-volatile storage elements formed, at least in part, on different portions of a substrate, and one or more control circuits in communication with the different sets of non-volatile storage elements. The one or more control circuits perform operations on non-volatile storage elements in the different sets of non-volatile storage elements, and bias the different portions of the substrate separately, while the operations are performed on the non-volatile storage elements therein.

Data can be read from a memory which indicates respective bias levels for each of the different portions of the substrate, in which case the biasing is responsive to the reading.

The different sets of non-volatile storage elements can be in different planes of a chip, where each plane includes a number of blocks, and each block is erasable as a unit. The different sets of non-volatile storage elements can be in different blocks, where each block is erasable as a unit. The different sets of non-volatile storage elements can be in different pages, where each page is programmed as a unit.

At least two different portions of the substrate can be biased at different bias levels. Also, the different portions of the substrate can be biased concurrently.

In another embodiment, a non-volatile storage system includes first and second sets of NAND strings formed, at least in part, on a p-well region, and one or more control circuits in communication with the first and second sets of NAND strings. The one or more control circuits, during a first time interval, perform operations on, and bias, the first set of NAND strings by controlling a first voltage provided to a source side of the first set of NAND strings and a second voltage provided to the p-well region, and, during the first time interval, float, or provide a fixed voltage to, a source side of the second set of NAND strings. A difference between the first and second voltages can be based on a desired bias level. The one or more control circuits can also float, or provide a fixed voltage to, a source side of a second set of NAND strings which are formed, at least in part, on the p-well region. A level of the fixed voltage can be set based on the desired bias level. Operations are not performed on the second set of NAND strings during the first time interval. The first voltage can be provided via a first source voltage supply line.

In one approach, the floating of the source side of the second set of NAND strings includes floating a second source voltage supply line for the second set of NAND strings. Or, the providing the fixed voltage to the source side of the second set of NAND strings includes providing the fixed voltage to the second source voltage supply line for the second set of NAND strings.

BRIEF DESCRIPTION OF THE DRAWINGS

FIGS. 5a-5h depict behavior of memory device parameters versus temperature and body bias level.

FIG. 6 depicts a control curve of body bias level versus temperature.

FIG. 7 depicts a process for setting a body bias level based on temperature, accounting for different temperature-dependent effects.

FIG. 8a-8c depict processes for operating non-volatile storage in which a body bias is applied.

FIG. 15 depicts a process for operating non-volatile storage in which separate body biases are applied at the chip, plane, block and/or page level.

DETAILED DESCRIPTION

The present invention provides a non-volatile storage system in which a body bias is applied to optimize performance.

Figure 1:
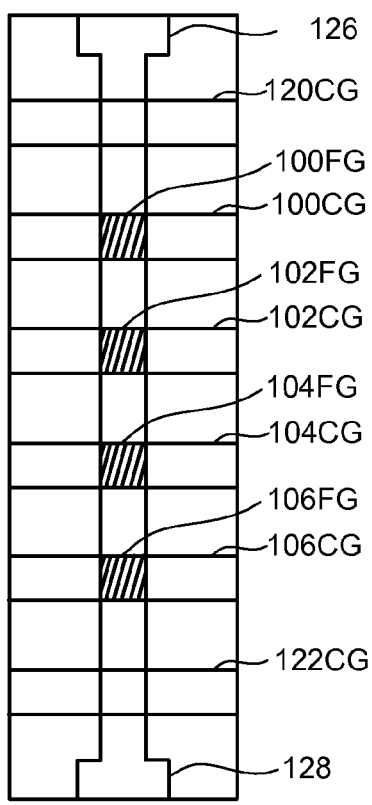
FIG. 1 is a top view of a NAND string.
Figure 2:
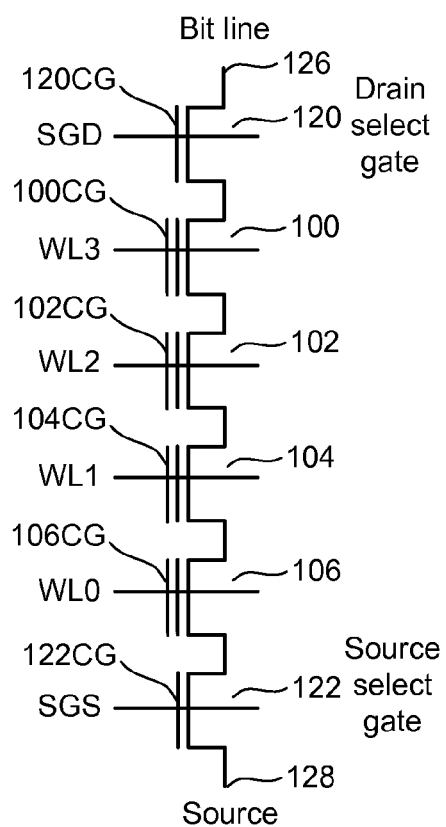
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to word line WL3, control gate 102CG is connected to word line WL2, control gate 104CG is connected to word line WL1, and control gate 106CG is connected to word line WL0. The control gates can also be provided as portions of the word lines. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD (drain select gate). Select gate 122 is connected to select line SGS (source select gate).

Figure 3:
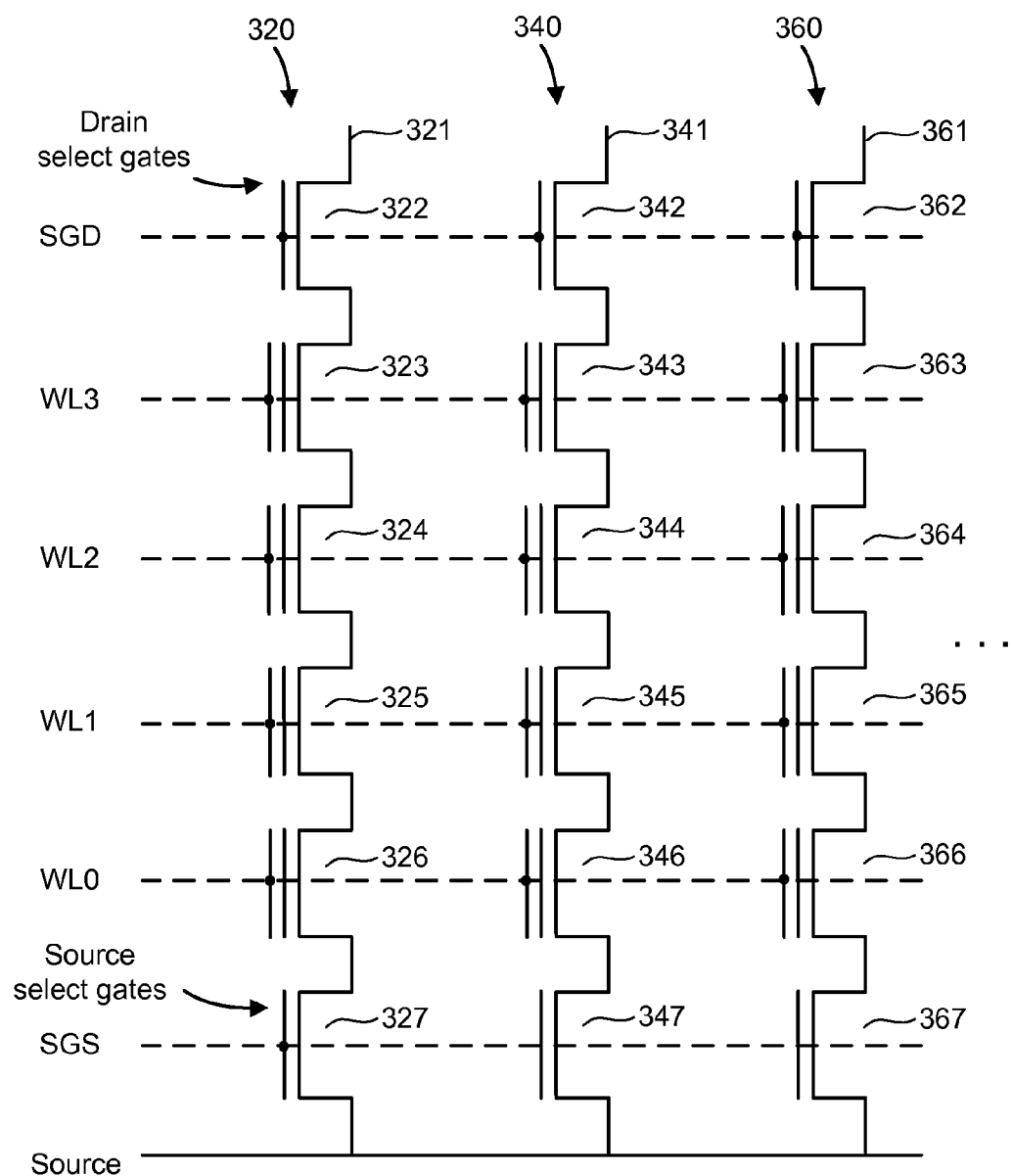
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. As can be seen, each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages (VTH) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,522,580, 5,570,315, 5,774,397, 6,046,935, 6,456,528 and 6,522,580, each of which is incorporated herein by reference.

When programming a flash storage element, a program voltage is applied to the control gate of the storage element and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

Figure 4:
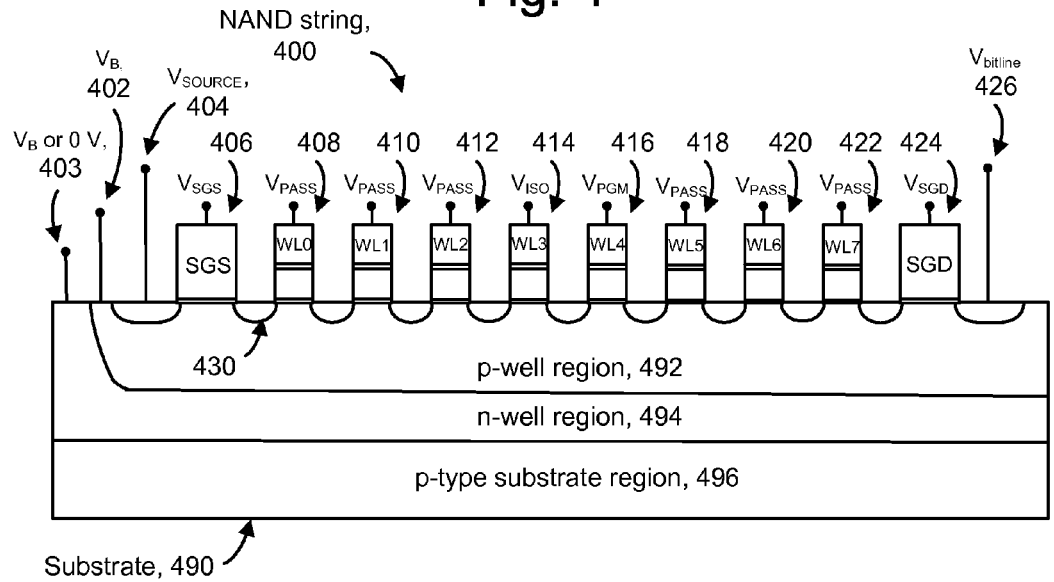
FIG. 4 depicts a cross-sectional view of a NAND string formed on a substrate.

FIG. 4 depicts a cross-sectional view of an NAND string formed on a substrate. The view is simplified and not to scale. The NAND string 400 includes a source-side select gate 406, a drain-side select gate 424, and eight storage elements 408, 410, 412, 414, 416, 418, 420 and 422, formed on a substrate 490. A number of source/drain regions, one example of which is source drain/region 430, are provided on either side of each storage element and the select gates 406 and 424. In one approach, the substrate 490 employs a triple-well technology which includes a p-well region 492 within an n-well region 494, which in turn is within a p-type substrate region 496. The NAND string and its non-volatile storage elements can be formed, at least in part, on the p-well region. A source supply line 404 with a potential of $V_{SOURCE}$ is provided in addition to a bit line 426 with a potential of $V_{BIT\ LINE}$. In one possible approach, a body bias voltage, $V_B$, is applied to the p-well region 492 via a terminal 402. A voltage can also be applied to the n-well region 494 via a terminal 403. In one approach, a bias is applied to the non-volatile storage elements by applying $V_B$ to the p-well region while grounding the n-well region (0V). In another approach, a bias is applied to the non-volatile storage elements by applying $V_B$ to both the p-well region and the n-well region.

During programming, $V_{PGM}$ is provided on a selected word line, in this example, WL4, which is associated with storage element 416. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. A pass voltage, $V_{PASS}$ is applied to the remaining word lines associated with NAND string 400, in one possible boosting scheme. $V_{SGS}$ and $V_{SGD}$ are applied to the select gates 406 and 424, respectively.

Figure 5A:
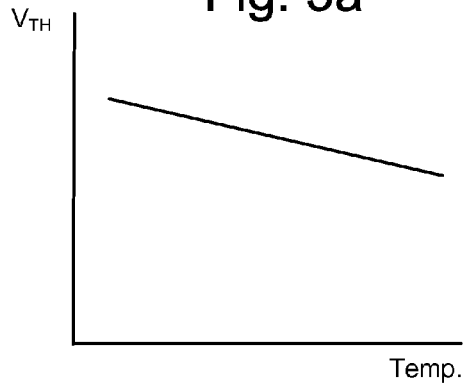

FIGS. 5a-5h depict behavior of memory device parameters versus temperature and body bias level. In non-volatile storage devices, such as NAND flash memory devices, temperature variations present various issues, e.g., in reading and writing data. A memory device is subject to varying temperatures based on the environment in which it is located. For example, some current memory devices are rated for use between −40° C. and +85° C. Temperature affects many transistor parameters, the dominant among which is the threshold voltage. As temperature rises, the threshold voltage ($V_{TH}$) drops by approximately 2 mV/° C., as depicted in FIG. 5a. $\Delta V_{TH}/\Delta$Temp. is one measure of a temperature coefficient. The temperature coefficient depends on various characteristics of the memory device, such as doping, oxide thickness and so forth. Moreover, the temperature coefficient is expected to increase in magnitude as memory dimensions are reduced.

Temperature variations can cause read errors and widen the threshold voltage distributions. One technique for compensating for temperature variations involves changing the read/verify voltages applied to a selected word line in a way which accounts for the temperature variation of a selected storage element's threshold voltage. However, this technique by itself is not efficient enough to prevent $V_{TH}$ distributions and margins between states from widening as temperature varies. Ideally, if one could fully compensate for temperature changes of all memory device parameters, that is, make all memory device parameters remain the same even though temperature changes, $V_{TH}$ distributions and margins would be the same at different temperatures. However, with existing compensation techniques, other memory device parameters are not compensated. For example, in addition to $V_{TH}$, other memory device parameters showing temperature sensitivity include sub-$V_{TH}$ slope (referred to as sub-threshold slope) and depletion layer width. Variations in these parameters also result in widening $V_{TH}$ distributions due to temperature changes. Further, although read and verify voltages can be changed with temperature, read voltages ($V_{READ}$) and/or select gate voltages ($V_{SGS}$ and $V_{SGD}$) are not typically varied with temperature.

Figure 5B:
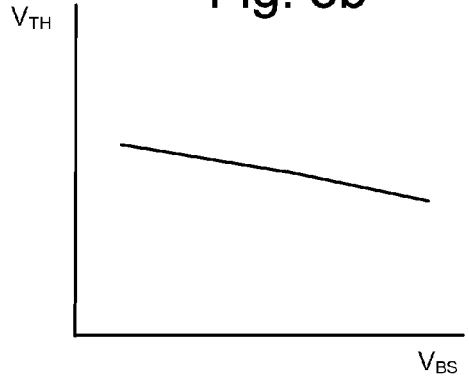

To address these issues, temperature compensation can be provided by applying a temperature-dependent body bias to the memory device. It has been observed that $V_{TH}$ decreases as bias voltage, $V_{BS}$, increases, as depicted in FIG. 5b. $V_{BS}$ denotes a difference between a bias voltage, $V_B$, applied to the p-well of the memory device and a voltage, $V_S$, at the source side of a storage element. Note that a positive bias, referred to as a forward body bias (FBB), or a negative bias, referred to as a reverse body bias (RBB), can be applied.

Figure 5C:
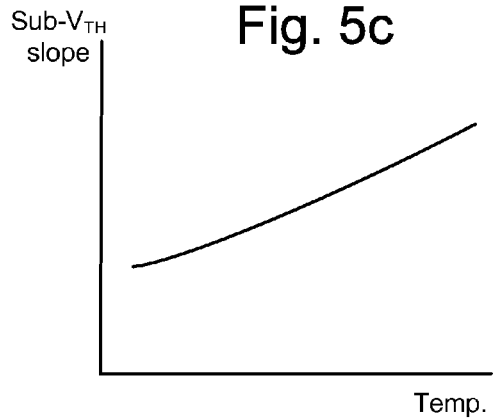
Figure 5D:
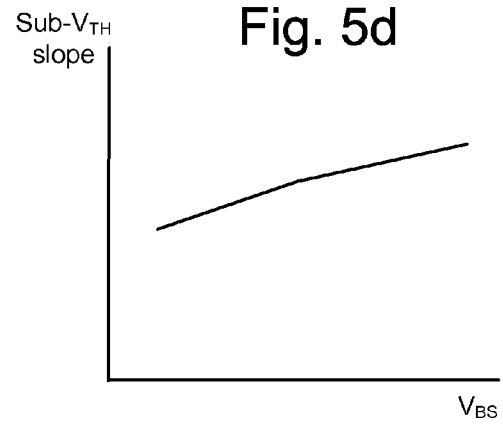
Figure 5E:
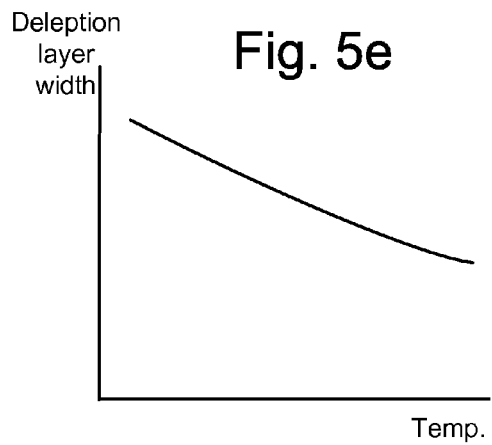
Figure 5F:
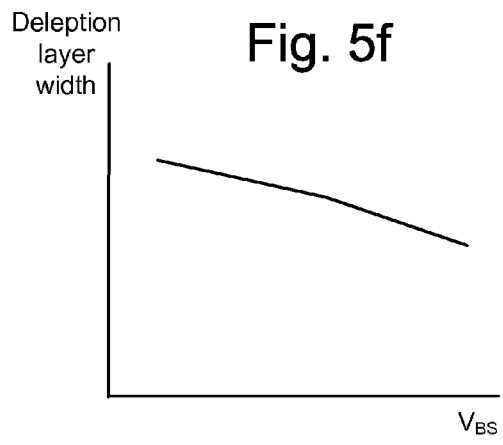

Sub-$V_{TH}$ slope is a measure of how difficult it is to sense the $V_{TH}$ of a storage element. In particular, sub-$V_{TH}$ slope=d($\log_{10}I_D$)/d$V_{CG}$, where $I_D$ is the drain current of a storage element and $V_{CG}$ is the control gate voltage. A lower sub-$V_{TH}$ slope is better for good sensing. Sub-$V_{TH}$ slope increases with temperature, as depicted in FIG. 5c. Further, FIG. 5d indicates that a lower $V_{BS}$ results in a lower sub-$V_{TH}$ slope. Thus, applying a lower $V_{BS}$ at higher temperatures to compensate for $V_{TH}$ can also partially compensate for the increase in sub-$V_{TH}$ slope. Further, depletion layer width is reduced as temperature increases, as depicted in FIG. 5e. Moreover, the depletion layer width drops as $V_{BS}$ increases, as depicted in FIG. 5f. Thus, applying a lower $V_{BS}$ at higher temperatures can partially compensate for the reduced depletion layer width at the higher temperatures. 1/f noise decreases as temperature increases, as depicted in FIG. 5g, and as $V_{BS}$ decreases, as depicted in FIG. 5h. Thus, the higher 1/f noise at lower temperatures can be partially compensated by a higher $V_{BS}$.

In particular, 1/f noise is produced in NAND storage elements due to traps in the tunnel oxide. This problem becomes worse with scaling. Experiments indicate that 1/f noise can be reduced in NAND arrays using forward body bias (FBB), in which $V_{BS}>0$ V. FBB can be used in various ways with reverse body bias (RBB), in which $V_{BS}<0$ V, in non-volatile storage systems. Further, while FBB does reduce 1/f noise, it can degrade sub-$V_{TH}$ slope. An option to gain the advantages of both FBB and RBB is to use FBB at lower temperatures when 1/f noise is high, and use zero bias or RBB at higher temperatures where sub-threshold slope degradation is more of an issue. Further, both the device doping and body bias value can be optimally chosen to gain benefits.

In one approach, for a FBB implementation, the body bias is applied to the p-well in which the storage elements are formed. The n-well can also be charged to the same voltage to minimize the forward current through the p-n junction formed between the two wells. The p-type substrate region can be grounded, in which case the p-n junction formed between the p-type region and the n-well is reverse biased when FBB is applied to a NAND array, for instance. RBB can be implemented in a NAND array by changing the potentials of the source, gate and drain while keeping the body grounded. In another approach, RBB is implemented by changing the body potential. For example, to change the body-to-source voltage ($V_{BS}$) from −0.5 V to −1 V, the source, gate, drain and body potentials initially can be chosen as 1 V, 5 V, 0.7 V and 0.5 V, respectively. These values are then changed to 1 V, 5 V, 0.7 V and 0 V, respectively. Specifically, in the first case, $V_{BS}=V_B-V_S=0.5-1=-0.5$ V and, in the second case, $V_{BS}=V_B-V_S=0-1=-1$ V.

FIG. 6 depicts a control curve of body bias level versus temperature. As mentioned above, reducing $V_{BS}$ as temperature increases can compensate for changes in $V_{TH}$ and other device parameters, thereby flattening the curves of FIGS. 5a, 5c, 5e and 5g. This approach improves upon other techniques in which only $V_{TH}$ is compensated. Further, the advantages achieved using the techniques disclosed herein are in contrast to compensation techniques used in high power logic devices. Such devices can regulate their temperature and therefore need not compensate for temperature variations. Moreover, compensation techniques used in high power logic devices do not account for the particular issues relating to non-volatile storage devices.

For instance, the compensation of sub-$V_{TH}$ slope enables uniform attenuation of sensing uncertainties across all temperature ranges. Further, 1/f noise is becoming a serious concern in NAND flash memories as well. The compensation of 1/f noise, which increases at lower temperatures, is a further benefit for non-volatile storage devices. The control curve of FIG. 6, which can represent a linear or non-linear function, can be implemented in different ways. In one approach, $V_{BS}$ is set based on a temperature-dependent reference signal. In an example implementation, $\Delta V_{BS}/\Delta$Temp. is approximately −4 mV/° C. so that a change in $V_{BS}$ of 0.4 mV results over a temperature range of 100° C. In this example, $V_{BS}$ may be 0.4 mV at −15° C. and 0 V at 85° C. Or, $V_{BS}$ can be set to 0 V at room temperature or other selected temperature. Generally, the optimal control curve for a particular non-volatile storage device can be determined based on test results and/or theoretical results which identify the temperature-varying behavior of the compensated parameters. In some cases, different body bias levels would result from consideration of different parameters alone, in which case an optimization can be performed to arrive at an optimal control curve. For example, an average of the different body bias levels can be taken to arrive at the optimal control curve. Or, the different body bias levels can be weighted based on the relative importance of the parameter on which they are based. In this way, the control curve can be optimized and customized.

FIG. 7 depicts a process for setting a body bias level based on temperature, accounting for different temperature-dependent effects. A temperature-dependent reference signal is provided to a body bias level determination process 710, which outputs a body bias level which is set to vary with temperature to compensate at least one temperature-varying characteristic of a set of non-volatile storage elements, including a threshold voltage 712, sub-$V_{TH}$ slope 714, depletion layer width 716 and noise 718.

Various techniques are known for providing a temperature-dependent reference signal. In one possible approach, a band gap circuit is used. For example, U.S. Pat. No. 6,801,454, titled "Voltage Generation Circuitry Having Temperature Compensation," incorporated herein by reference, describes a voltage generation circuit which outputs read voltages to a non-volatile memory based on a temperature coefficient. The circuit uses a band gap current which includes a temperature-independent portion and a temperature-dependent portion which increases as temperature increases. U.S. Pat. No. 6,560,152, titled "Non-Volatile Memory With Temperature-Compensated Data Read," incorporated herein by reference, uses a bias generator circuit which biases a voltage which is applied to a source or drain of a data storage element. U.S. Pat. No. 5,172,338, titled "Multi-State EEPROM Read and Write Circuits and Techniques", incorporated herein by reference, describes a temperature-compensation technique which uses reference storage cells that are formed in the same manner, and on the same integrated circuit chip, as data storage cells. The reference storage cells provide reference levels against which measured currents or voltages of the selected cells are compared. Temperature compensation is provided since the reference levels are affected by temperature in the same manner as the values read from the data storage cells. Any of these techniques, as well as any other known techniques, can be used to provide a temperature-dependent body bias.

Figure 8C:
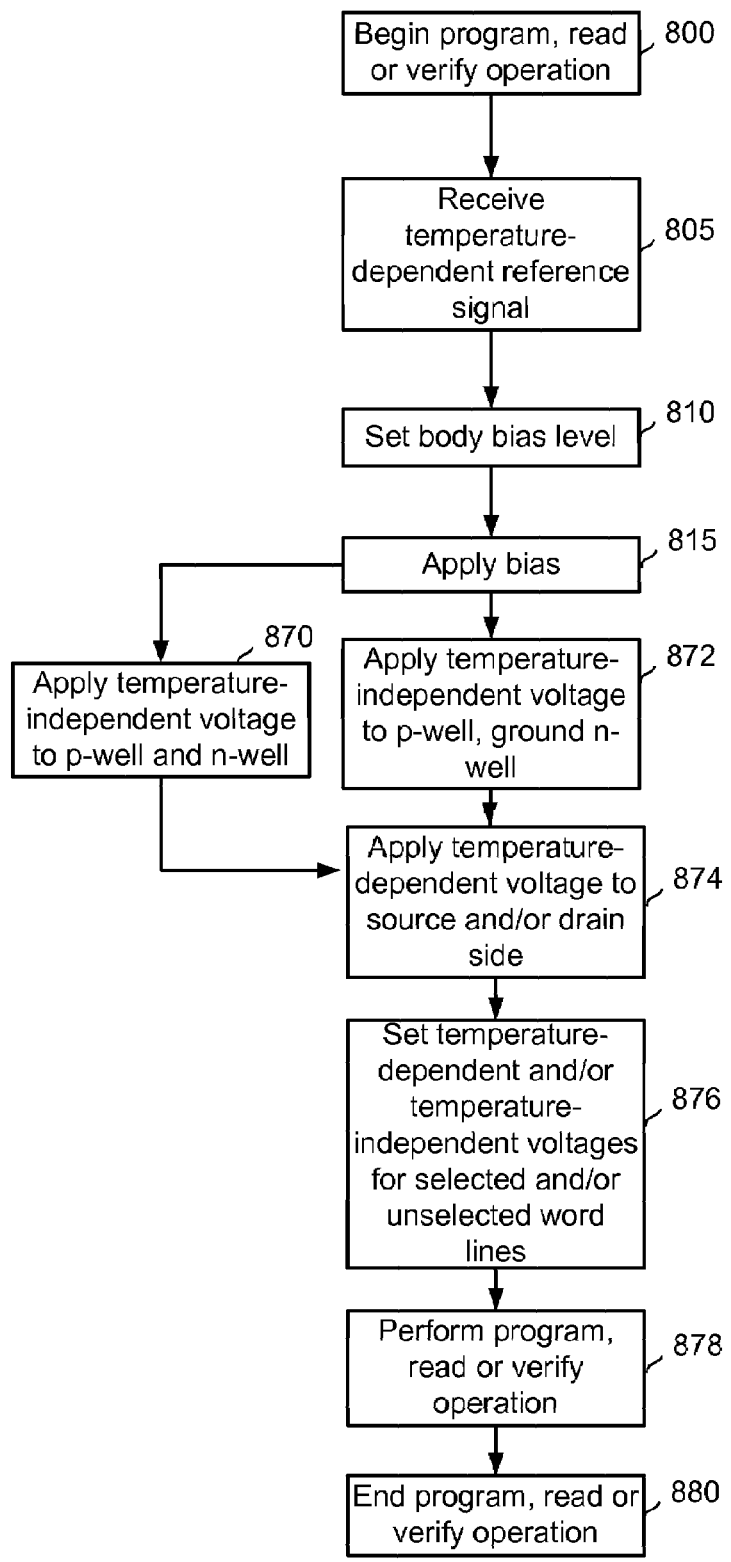

FIGS. 8a-8c depict processes for operating non-volatile storage in which a body bias is applied. Note that in this and other flowcharts provided herein, the steps indicated are not necessarily discrete steps which are performed separately and are not necessarily performed in the order shown. In one approach, depicted in FIG. 8a, the body bias applied to a NAND flash array during verify and read operations (or program, verify and read operations) is designed to be a function of temperature. For example, as mentioned, a higher value of $V_{BS}$ can be applied to a NAND array at lower temperatures than at higher temperatures. This compensates for temperature-dependent changes in the $V_{TH}$ of storage elements of the array, and also partially compensates for temperature-dependent variations in sub-threshold slope, depletion region width and "grey zone" margin. When the body is given a positive voltage with respect to the source and drain regions, the p-n junction diodes of the storage elements will conduct a forward bias current if a sufficiently high bias voltage is applied, e.g., $V_{BS}>0.6$ V at room temperature. At lower temperatures, the forward bias current is reduced, so applying a body voltage of approximately 0.4 V at −25° C., for instance, will not cause a high forward bias current.

Moreover, a particular value of body bias can be applied during program, verify and read operations or just during verify and read operations. If the body bias is applied only during verify and read operations and the body is grounded during programming, the body is charged and discharged during every program/verify cycle. While this approach is feasible, it consumes additional time and power. Maintaining the body bias during program, verify and read operations avoids these drawbacks. For example, a body bias can be set during initial boot up of the memory device.

As an illustration, FIGS. 8a-8c depict processes in which a body bias level is set for an individual program, read or verify operation. As mentioned, the body bias level need not be set and applied for each operation but can be maintained at a relatively steady level. This level can be adjusted periodically to account for changes in temperature, for instance.

In particular, in the process of FIG. 8a, step 800 includes beginning a program, read or verify operation. Step 805 includes receiving a temperature-dependent reference signal. Step 810 includes setting a body bias level, and step 815 includes applying the bias. For example, this can involve applying a temperature-dependent voltage to the p-well and n-well of the substrate (step 820), applying the temperature-dependent voltage to the p-well while grounding the n-well (step 825) or grounding the body and applying the temperature-dependent voltage to the source and/or drain side of the set of storage elements (step 830). In steps 820 and 825, a temperature-dependent voltage ($V_B$) is applied to the substrate, where a level of the temperature-dependent voltage is based on the desired body bias level.

In step 830, a temperature-independent voltage, such as 0 V (ground voltage), is applied to the substrate, and a temperature-dependent voltage is applied to the source and/or drain side of the set of non-volatile storage elements such as in a block. For instance, the temperature-independent voltage can be applied concurrently to the p-well region of the substrate and to the n-well region of the substrate (or the n-well region can be grounded), where the set of non-volatile storage elements are formed, at least in part, on the p-well region, the p-well region is provided in the n-well region, and the n-well region is provided in a p-type substrate region. Further, a difference between the temperature-independent voltage and the temperature-dependent voltage can correspond to the desired bias level. Also, the biasing can involve a forward body bias or reverse body bias. At step 835, temperature-independent word line voltages are set, in one possible approach (see FIGS. 9a and 9b). At step 840, the program, read or verify operation is performed and, at step 845, the operation ends.

FIG. 8b depicts a process in which a body bias is applied via a temperature-dependent voltage to the p-well and n-well (step 850), or to the p-well while grounding the n-well (step 852), while a temperature-independent voltage is applied to the source and/or drain side of the set of storage elements (step 854). Steps 800-815 are the same as discussed previously. Further, at step 856, temperature-dependent and/or temperature-independent voltages can be set for selected and/or unselected word lines which communicate with the control gates of selected and/or unselected storage elements.

For instance, a temperature-dependent read or verify voltage can be applied to a selected word line of one or more non-volatile storage elements undergoing read or verify operations. It is also possible for the temperature-dependent read or verify voltage to vary with temperature according to a first temperature coefficient, and for the temperature-dependent bias voltage to vary with temperature according to a second temperature coefficient which differs from the first temperature coefficient.

Thus, the temperature-dependence of the biasing and of the reading or verifying can be optimally tailored. For example, while the body bias value could change from 0 V at −15° C. to −0.4 V at 100° C., indicating that the temperature coefficient is +0.4/100° C., the read voltage could increase from 3 V at −15° C. to 3.4 V at 100° C., indicating that the temperature coefficient is +0.4 V for a 100° C. increase in temperature. Thus, the polarity and/or magnitude of the temperature coefficients can differ. A similar approach can be taken for the voltages applied to the unselected word lines, e.g., such that the temperature-dependent voltages applied to the unselected word lines vary with temperature according to a third temperature coefficient, and the temperature-dependent bias voltage varies with temperature according to the second temperature coefficient which differs from the third temperature coefficient. Further, the temperature coefficient for the voltages applied to the unselected word lines can differ from the temperature coefficient for the voltage applied to the selected word line. Steps 858 and 860 correspond to steps 840 and 845, respectively, discussed previously.

FIG. 8c depicts a process in which a body bias is applied via a temperature-independent voltage to the p-well and n-well (step 870), or to the p-well while grounding the n-well (step 872), while a temperature-dependent voltage is applied to the source and/or drain side of the set of storage elements (step 874). Thus, in one possible approach, the p-well and n-well voltage are held constant while the source line (source side), bit line (drain side) and selected storage element control gate voltages vary with temperature according to one temperature coefficient, and Vread for the unselected storage elements vary with temperature according to another temperature coefficient, during a read or verify operation. In one scenario, at higher temperatures, above room temperature, the source line, bit line and selected storage element control gate voltages increase while Vread decreases.

Steps 800-815 are the same as discussed previously. Further, at step 876, temperature-dependent and/or temperature-independent voltages can be set for selected and/or unselected word lines which communicate with the control gates of selected and/or unselected storage elements, as discussed previously.

For instance, a temperature-dependent read or verify voltage can be applied to a selected word line of one or more non-volatile storage elements undergoing read or verify operations. It is also possible for the temperature-dependent read or verify voltage to vary with temperature according to a first temperature coefficient, and for the temperature-dependent voltage applied to the source and/or drain side of the set of storage elements to vary with temperature according to a second temperature coefficient which differs from the first temperature coefficient.

A similar approach can be taken for the voltages applied to the unselected word lines, e.g., such that the temperature-dependent voltages applied to the unselected word lines vary with temperature according to a third temperature coefficient, and the temperature-dependent voltage applied to the source and/or drain side of the set of storage elements varies with temperature according to the second temperature coefficient which differs from the third temperature coefficient. Further, the temperature coefficient for the voltages applied to the unselected word lines can differ from the temperature coefficient for the voltage applied to the selected word line. Steps 878 and 880 correspond to steps 840 and 845, respectively, discussed previously.

Figure 9A:
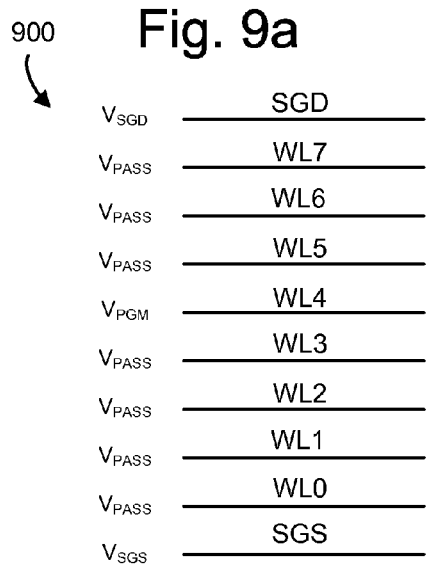
FIG. 9a depicts voltages applied to a set of word lines during a program operation.

FIG. 9a depicts voltages applied to a set 900 of word lines during a program operation. The word lines include WL0 through WL7. In this example, WL4 is the selected word line so storage elements associated with WL4 receive a program voltage $V_{PGM}$. WL0-WL3 and WL5-WL7 are unselected word lines. A pass voltage, $V_{PASS}$, is applied to the unselected word lines in one example of a self-boosting scheme.

Figure 9B:
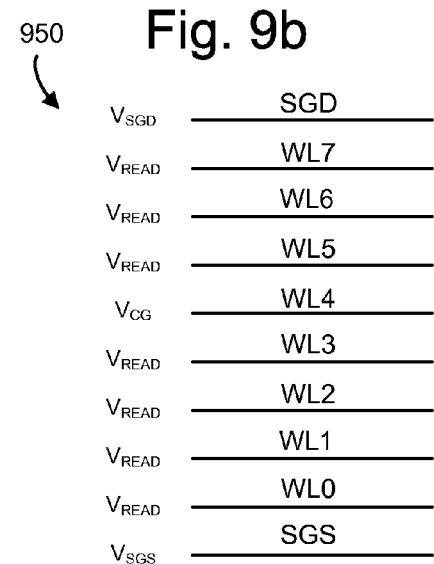
FIG. 9b depicts voltages applied to a set of word lines during a read or verify operation.

In read and verify operations, read and/or verify voltages which are applied to the word lines can be temperature independent. For example, FIG. 9b depicts voltages applied to a set of word lines during a read or verify operation. During a read or verify operation, in which one or more storage elements associated with WL4 are read or verified, for instance, the unselected word lines WL0-WL3 and WL5-WL7 are raised to a read pass voltage, $V_{READ}$, and the selected word line WL4 is connected to a control gate voltage, $V_{CG}$, a level of which is specified for each read and verify operation, in order to determine whether a $V_{TH}$ of the concerned storage element or elements is above or below such level.

Figure 10A:
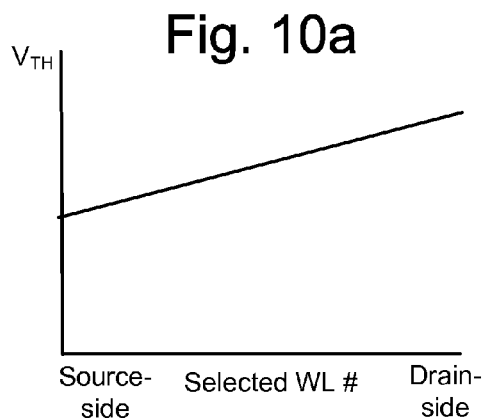
FIG. 10a depicts a threshold voltage as a function of word line position.

$V_{CG}$ is a temperature-independent voltage which is applied to a selected word line in a set of word lines during biasing of the substrate to determine a condition, such as a verify or read level, of at least one non-volatile storage element which is associated with the selected word line. The biasing is set to vary with temperature to compensate one or more temperature-varying characteristics of non-volatile storage elements of the set of non-volatile storage elements. These characteristics can include a threshold voltage, slope of sub-threshold voltage, depletion layer width and noise. The $V_{READ}$ voltages are temperature-independent voltages which are applied to unselected word lines during the biasing. $V_{SGD}$ and $V_{SGS}$ can similarly be temperature-independent, in one possible implementation FIG. 10a depicts a change in threshold voltage as a function of word line position. Body bias can also be used to compensate for word-line dependent performance variations in a non-volatile storage system. For example, during read/verify operations, higher word lines in a NAND string, e.g., word lines at the drain side of a NAND string, have a lower body-to-source voltage ($V_{BS}$) than word lines at the source side of a NAND string. This can occur because the body is grounded, and the source potential of higher word lines is higher due to the potential drop across the lower transistors of the NAND string. As a result, for a given programming state, $V_{TH}$ levels of storage elements associated with the higher word lines is increased relative to storage elements associated with the lower word lines, as depicted in FIG. 10a. Further, $V_{TH}$ distributions of the storage elements associated with the higher word lines can differ from those of the storage elements associated with the lower word lines. However, conventionally, voltages applied to the word lines for programming, read or verify operations are not changed based on word line position. The changes of $V_{TH}$ across the NAND string prevent a designer from choosing optimal program, read and verify voltages, and can result in higher read/write disturbs, reduction of $V_{TH}$ window, increased programming times, higher error rates and/or non-optimal NAND string resistance. Moreover, these issues will be even more of a concern for future NAND strings which have more storage elements, e.g., 64-element NAND strings.

Figure 10B:
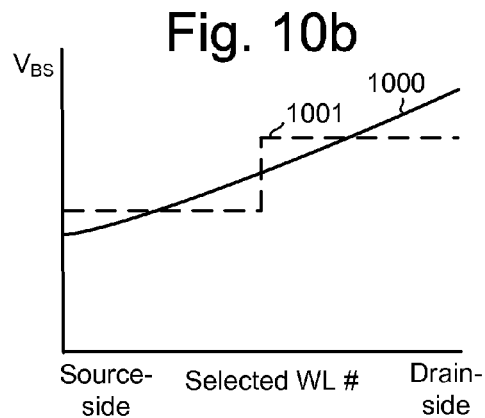
FIGS. 10b-10d depict example control curves of body bias as a function of word line position.
Figure 10C:
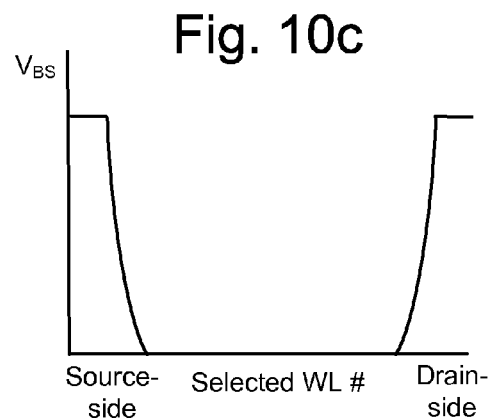
Figure 10D:
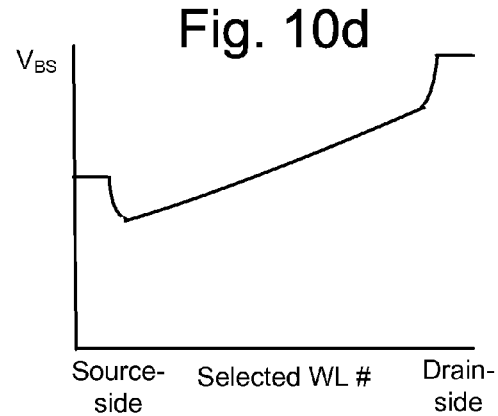

FIGS. 10b-10d depict example control curves of body bias as a function of word line position. To address these issues, a body bias can be applied to reduce or eliminate variations in $V_{TH}$ due to word line position. For example, as depicted by the control curve of in FIG. 10b, which can represent a linear or non-linear function, when a word line is selected for a program, read or verify operation, a lower body potential can be applied when the selected word line is a lower, source-side, word line, and a higher body potential can be applied when the selected word line is a higher, drain-side, word line. This technique can tighten the width of the natural distribution of $V_{TH}$ values for the NAND array and thus enable a choice of optimal program, read and verify voltages. In one approach (curve 1000), $V_{BS}$ increase gradually with the selected word line position. In another approach (curve 1001), $V_{BS}$ increases in a step-wise manner to reduce the number of adjustments. For example, two $V_{BS}$ levels can be set; one for WL0-WL15 and one for WL16-WL31 (assuming a 32-element NAND string). In this case, a first bias is applied when the selected word line is in a first group of multiple word lines, and a second bias is applied when the selected word line is in a second group of multiple word lines. Additional groups may be used as well.

In another aspect, a different body bias is applied when a selected word line is an end word line, e.g., one or more word lines which are adjacent to the source or drain side of a NAND string. This approach is based on the observation that gate-induced drain leakage (GIDL) is a function of body potential. Applying a different substrate bias when the selected word line is WL0 or WL31, in a 32-element NAND string, as depicted in FIG. 10c, for instance, can reduce GIDL. In another possible approach, depicted in FIG. 10d, $V_{BS}$ is increased gradually for selected word lines which are closer to the drain-side of a NAND string, while a further variation is exhibited when the selected word line is an end word line.

Generally, the optimal control curve for a particular non-volatile storage device can be determined based on test results and/or theoretical results which identify the selected word line-dependent behavior of the compensated parameters.

The different body potentials can be applied for program, verify and read operations (or just verify and read operations) of different word lines in a NAND string. Essentially, the body potential becomes a function of the word line number. Lower body potentials are applied to lower word lines such as WL0, WL1, WL2, etc., while higher body potentials are applied to higher word lines such as WL29, WL30, WL31, etc., so that $V_{BS}$ is equalized for all word lines. As a result, natural $V_{TH}$ distributions of a NAND array can be tighter, resulting in many benefits such as reduction of disturbs, larger $V_{TH}$ window, reduced programming times, higher reliability and/or improved NAND string resistance. Further, the benefits obtained from this technique will be even greater when 64-element NAND strings are used.

Figure 10E:
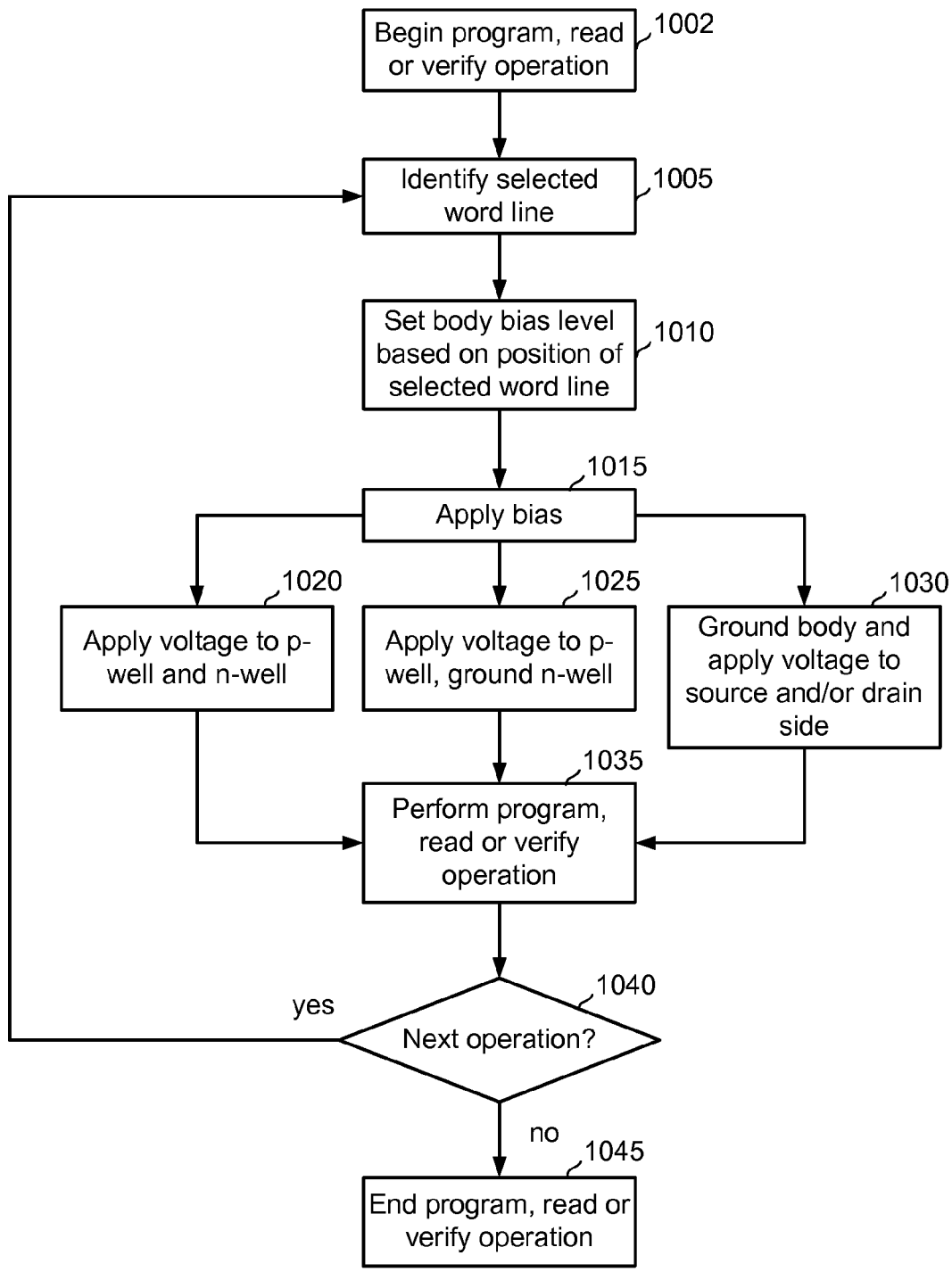
FIG. 10e depicts a process for operating non-volatile storage in which body bias is varied based on selected word line position.

FIG. 10e depicts a process for operating non-volatile storage in which body bias is varied based on selected word line position. Step 1002 includes beginning a program, read or verify operation. Step 1005 includes identifying the selected word line, e.g., the word line associated with one or more storage elements which are undergoing the program, read or verify operation. Step 1010 includes setting the body bias level based on the position of the selected word line, as discussed above. Step 1015 includes applying the bias. For example, this can involve applying a voltage to the p-well and n-well of the substrate (step 1020), applying a voltage to the p-well while grounding the n-well (step 1025) or grounding the body and applying a voltage to the source and/or drain side of the set of storage elements (step 1030). At step 1035, the program, read or verify operation is performed. This can involve applying a first voltage, such as a control gate read or verify voltage, to a selected word line of a set of word lines to determine a condition of at least one non-volatile storage element of a set of non-volatile storage elements, where the at least one non-volatile storage element is in communication with the selected word line, and the set of non-volatile storage elements is in communication with the set of word lines. The substrate is biased while applying the first voltage, and a level of the biasing varies based on a position of the selected word line in the set of word lines. For example, the biasing level can increase when the selected word line is closer to a drain-side of the set of word lines, and/or the biasing level can vary based on whether or not the selected word line is an end word line in the set of word lines.

At decision step 1040, if there is a next operation to perform, the control flow returns to step 1005, where the selected word line involved in the next operation is identified. If the next operation involves the same selected word line, no change to the body bias is needed. If there is a new selected word line, a new body bias level may be set at step 1010. At decision step 1040, if there is no next operation to perform, the program, read or verify operation ends (step 1045).

Figure 11:
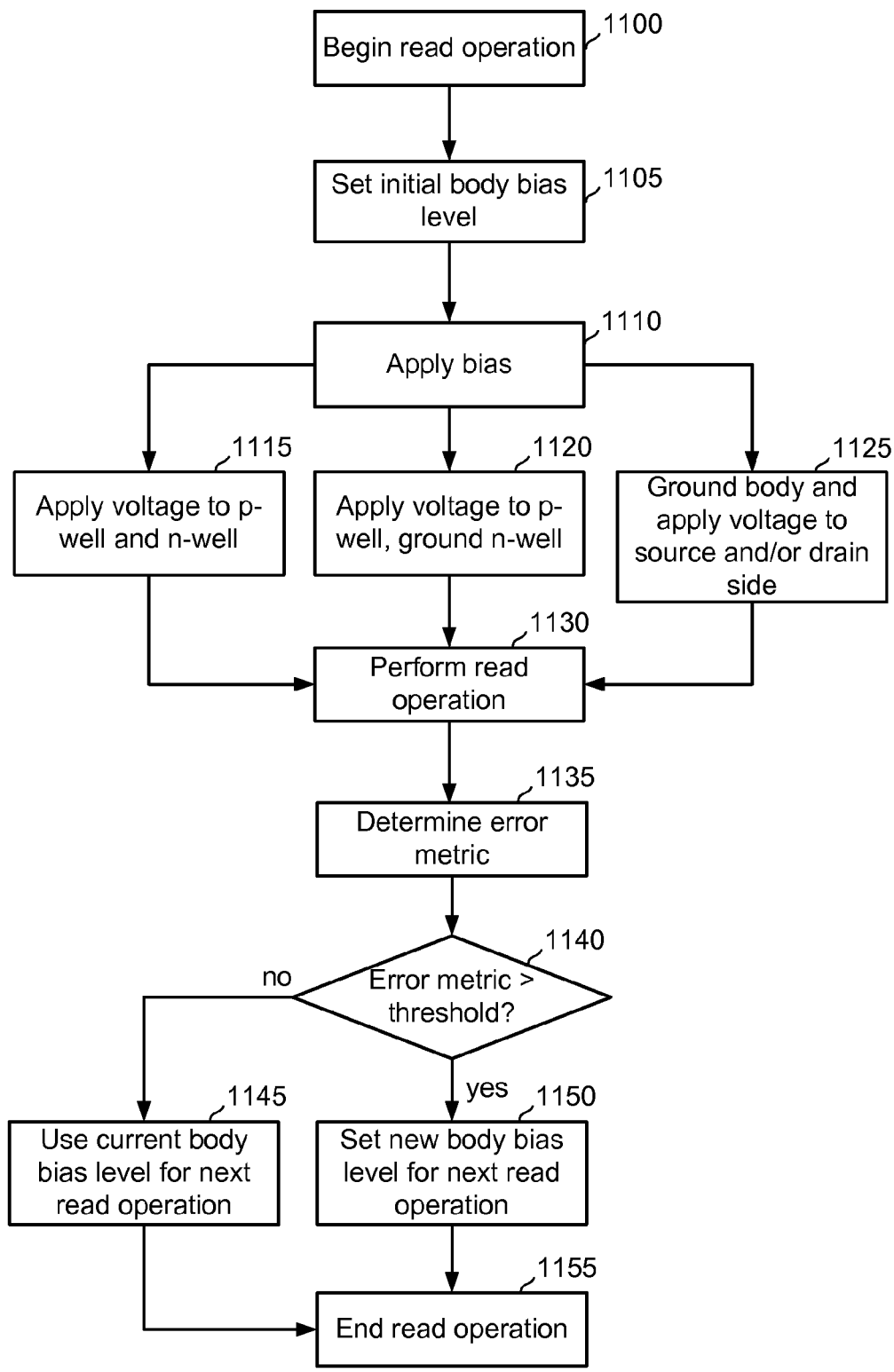
FIG. 11 depicts a process for operating non-volatile storage in which body bias is varied based on an error metric.

FIG. 11 depicts a process for operating non-volatile storage in which body bias is varied based on an error metric. Body bias can also be set adaptively to reduce read errors in a non-volatile storage system. While reverse body bias improves the subthreshold slope, it can cause junction leakage currents to increase. Also, maintaining a constant value of reverse bias can be problematic, e.g., when a source voltage other than 0 V is used. So, the optimal body bias value is not always the most reverse biased one. Changing the body bias value based on an error count is an alternative technique for selecting an optimal body bias value.

A memory array can be divided into a large number of blocks of storage elements, where the block is erased as a unit. Further, each block can be divided into a number of pages, e.g., 8, 32, 64 or more pages, where the page is programmed as a unit. A page can store one or more sectors, where a sector includes user data and overhead data, such as an error correcting or error detecting code bits that have been calculated from the user data of the sector. A sector of user data is typically 512 bytes, while overhead data is typically an additional 16-20 bytes. The error correcting or error detecting code bits can be calculated when data is being programmed into the array. Subsequently, when reading the sectors, an error count can be determined based on errors detected by the error correcting or detecting code. Error correcting codes (ECCs), such as Hamming codes, can detect and correct some errors, while error detecting codes, such as those using parity bits or checksums, can only detect errors without correcting them. In particular, the read sector data is run through the error correcting or detecting code to see if the output is consistent with the error correcting or detecting bits. If the output is not consistent, there is an error in the sector. Accordingly, an error metric such as an error count can be generated based on a number of errors which are detected for a sector or other unit. The count may include all detected errors, including those which can be corrected, or only errors which cannot be corrected, for instance. The count can be expressed as a raw count, a percentage, or other error metric.

For example, consider a NAND array in which ECC bits are used to correct read errors, each set of ECC bits handles 512 bytes of user data and the ECC can correct a maximum of eight errors. The number of bit errors in the ECC is monitored during each read of the array. When the number of bit errors exceeds a threshold, such as four errors, the body bias applied to these 512 bytes is reduced the next time data is written or verified. Further, when the data is read again, the number of bit errors is monitored and it is seen if the number of failed bits is reduced. This procedure may be repeated, e.g., three times, to obtain an average number of failed bits. If the average number of failed bits is reduced with the new body bias value, the new body bias value is retained. Otherwise, in one approach, $V_{BS}$ is made higher than the initial value and subsequent error counts are monitored to determine if the new $V_{BS}$ is appropriate. In another approach, the body bias is increased above an initial value if the error metric exceeds a threshold, then decreased below the initial value if the increased value does not result in fewer errors. $V_{BS}$ could also be changed in proportion to the error count, so that a larger error count results in a larger change in $V_{BS}$. The proportion can be linear or non-linear. Further, while the example described considered only 512 bytes of data, one could apply this kind of adaptive body bias process across an entire block or plane.

The above-described process is summarized in FIG. 11, in which step 1100 includes beginning a read operation and step 1105 includes setting an initial body bias level. Step 1110 includes applying the bias. For example, this can involve applying a voltage to the p-well and n-well of the substrate (step 1115), applying a voltage to the p-well while grounding the n-well (step 1120) or grounding the body and applying a voltage to the source and/or drain side of the set of storage elements (step 1125). At step 1130, the read operation is performed and, at step 1135, an error metric such as an error count is determined. In one approach, the error metric is based on multiple read operations. Further, the error metric can be for one or more pages, blocks or other sets of storage elements. In one approach, the error metric is determined from multiple error metrics obtained from reading non-volatile storage elements in multiple sets of non-volatile storage elements. An average or mean of the multiple error metrics can be used, for instance. At decision step 1140, if the error metric exceeds a threshold, a new body bias level is set for a next read operation and, at step 1155, the read operation ends. At decision step 1140, if the error metric does not exceed the threshold, the current body bias level is used for the next read operation (step 1145).

Thus, the process involves reading non-volatile storage elements in at least one set of non-volatile storage elements while biasing a substrate at a first bias level, and based on the reading, determining an error metric. If the error metric exceeds a threshold, a second bias level is determined for biasing the substrate when performing a subsequent read of non-volatile storage elements in the at least one set of non-volatile storage elements.

Figure 12A:
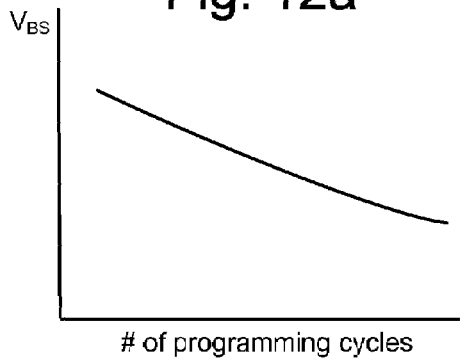
FIG. 12a depicts a control curve of body bias as a function of a number of programming cycles.

FIG. 12*a* depicts a change in body bias as a function of a number of programming cycles. Body bias can also be set adaptively based on programming cycles experienced by a memory device as the memory device ages. The performance of cycled memory devices can vary from that of fresh devices. For example, cycled memory devices typically program faster than fresh devices due to charge trapping. In particular, as a non-volatile memory device undergoes many programming cycles, charge becomes trapped in the insulator or dielectric between the floating gate and the channel region. This trapping of charge shifts the threshold voltage to a higher level, which allows the memory element to program faster while also making it harder to erase the charge in the element. Cycled devices also have higher sub-threshold slope, which makes sensing difficult.

Various advantages can be achieved by setting the body bias level as a function of cycling. In one approach, the subthreshold slope degradation with cycling can be compensated with applying a lower body bias value with cycling, as depicted in FIG. 12*a*, which represents a linear or non-linear control curve. Further, this varying of body bias with cycling can be performed over an entire plane of devices or even across an entire chip, since wear leveling can ensure that cycling is reasonably uniform over the entire chip.

Generally, the optimal control curve for a particular non-volatile storage device can be determined based on test results and/or theoretical results which identify the cycle-dependent behavior of the compensated parameters. For instance, while the example control curve of FIG. 12a depicts a decrease in body bias with programming cycles, the optimal body bias can increase or decrease with cycling depending on different factors.

Figure 12B:
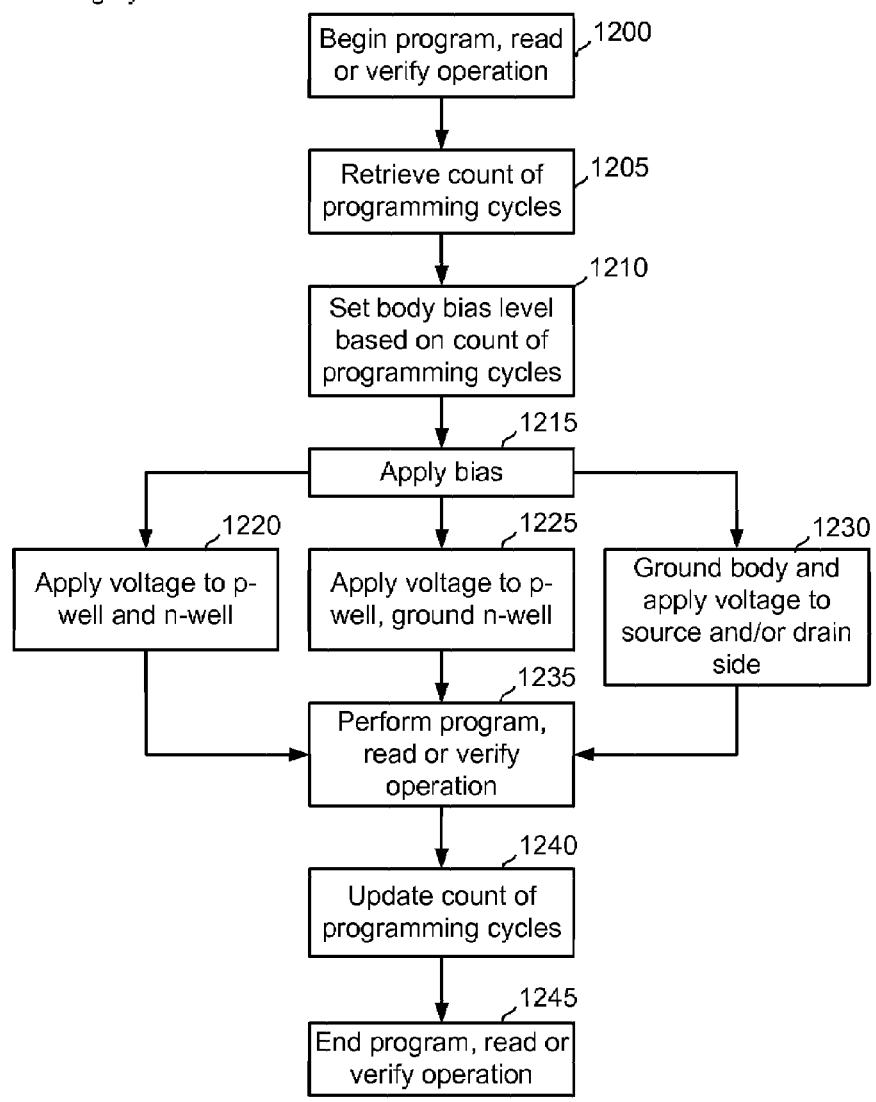
FIG. 12b depicts a process for operating non-volatile storage in which body bias is varied based on a number of programming cycles.

The above-described process is summarized in FIG. 12b, which depicts a process for operating non-volatile storage in which body bias is varied based on a number of programming cycles. Step 1200 includes beginning a program, read or verify operation and step 1205 includes retrieving a count of programming cycles. In one approach, the cycle count is stored as data in the non-volatile storage system. This data can be read to obtain a cycle count which is used to determine the body bias level. Step 1210 includes setting a body bias level based on the count of programming cycles, and step 1215 includes applying the bias. For example, this can involve applying a voltage to the p-well and n-well of the substrate (step 1220), applying a voltage to the p-well while grounding the n-well (step 1225) or grounding the body and applying a voltage to the source and/or, drain side of the set of storage elements (step 1230). At step 1235, the program, read or verify operation is performed and, at step 1240, the count of programming cycles is updated. At step 1245, the program, read or verify operation ends.

The process thus involves tracking programming cycles experienced by at least one set of non-volatile storage elements, and biasing the substrate at a bias level during operations performed on the at least one set of non-volatile storage elements, where the bias level is based on the tracking. In one approach, the bias level decreases as the number of programming cycles increases. The tracking of the programming cycles can include separately tracking programming cycles experienced by different sets of non-volatile storage elements which are formed on different portions of a substrate, in which case an aggregate usage metric can be determined based on the separate tracking, and the bias level is based on the aggregate usage metric. For example, the usage metric for each set can be a count of programming cycles for the set, and the aggregate usage metric can be an average or mean of the individual usage metrics. In another approach, the tracking of the programming cycles can include separately tracking programming cycles experienced by different sets of non-volatile storage elements which are formed on different portions of a substrate, in which case the different portions of the substrate are biased at different bias levels during operations performed on the different sets of non-volatile storage elements, and the different bias levels are based on the tracking.

Figure 13A:
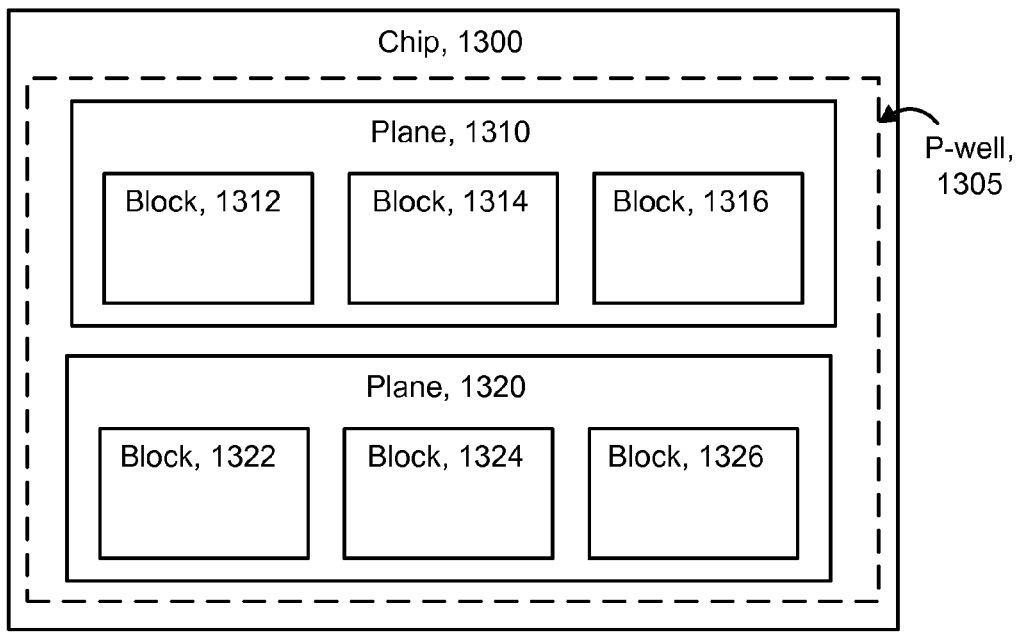
FIG. 13a depicts non-volatile storage in which planes and blocks of a chip have a common body bias.

FIG. 13a depicts non-volatile storage in which planes and blocks of a chip have a common body bias. Each chip, plane, block and/or page associated with a non-volatile storage system can receive its own, separate optimal body bias which maximizes its performance. In some cases, a device such as a secure digital (SD) memory card could have several stacked chips. The storage elements can be considered to be arranged in a hierarchy, where the chip level represents the highest level and the plane, block and/or page levels represent successively lower levels. A chip may include a memory device, a plane may include multiple blocks, a block may include a set of non-volatile storage elements in communication with a set of word lines, and a page may include selected non-volatile storage elements (e.g., odd or even) associated with a given word line, in one possible approach. The optimal body bias for each chip, plane, block and/or page can vary based on factors such as subthreshold slope, cell source noise, cycling, error count and the like. For example, one chip, plane, block and/or page may have experienced more cycles than another. In another example, one chip, plane, block and/or page may have a different bias than another for reducing an error count, as discussed previously. In one example implementation, a chip 1300 includes a p-well 1305 in which a plane 1310, with blocks 1312, 1314 and 1316 are formed, and a plane 1320, in which blocks 1322, 1324 and 1326 are formed. In this case, a common body bias is applied to each of the components via the p-well 1305, in one approach.

The body bias value for any block or page can be stored in a table or other data structure in a control, where the body bias value can be obtained by giving the block or page address. Before reading each block or page, the data stored in the above mentioned table is accessed to obtain the body bias value to be used.

Figure 13B:
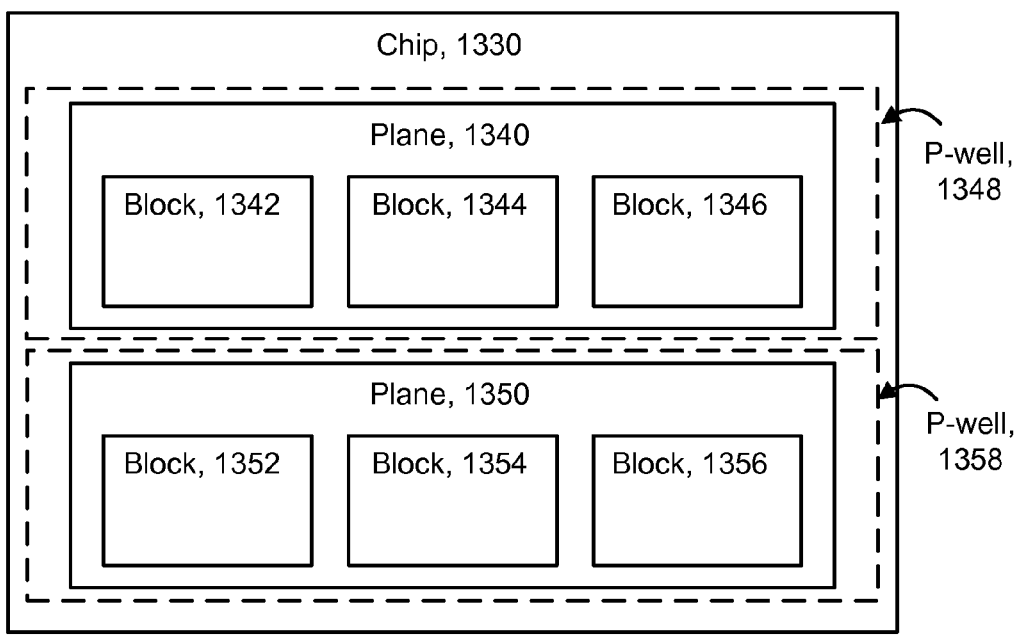
FIG. 13b depicts non-volatile storage in which planes of a chip have separate body biases.

FIG. 13b depicts non-volatile storage in which planes of a chip have separate body biases. A chip 1330 includes a p-well 1348 in which a plane 1340, with blocks 1342, 1344 and 1346 are formed, and a plane 1350, in which blocks 1352, 1354 and 1356 are formed. In this case, separate body biases are applied to each of the planes 1340 and 1350 via the p-wells 1348 and 1358, respectively.

Similarly, different blocks of a chip can have their own optimal body bias values. It must be noted that although different blocks could share the same p-well, they can be accessed at different periods of time, thus allowing different body bias values to be used when they are accessed.

Figure 14A:
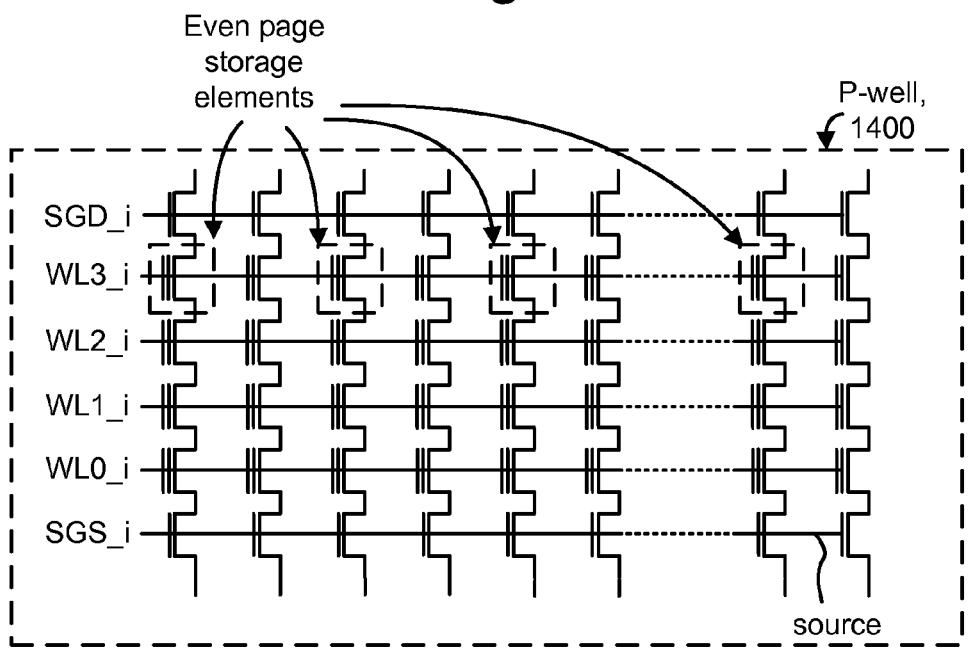
FIG. 14a depicts non-volatile storage in which a body bias is applied for storage elements associated with an even page.
Figure 14B:
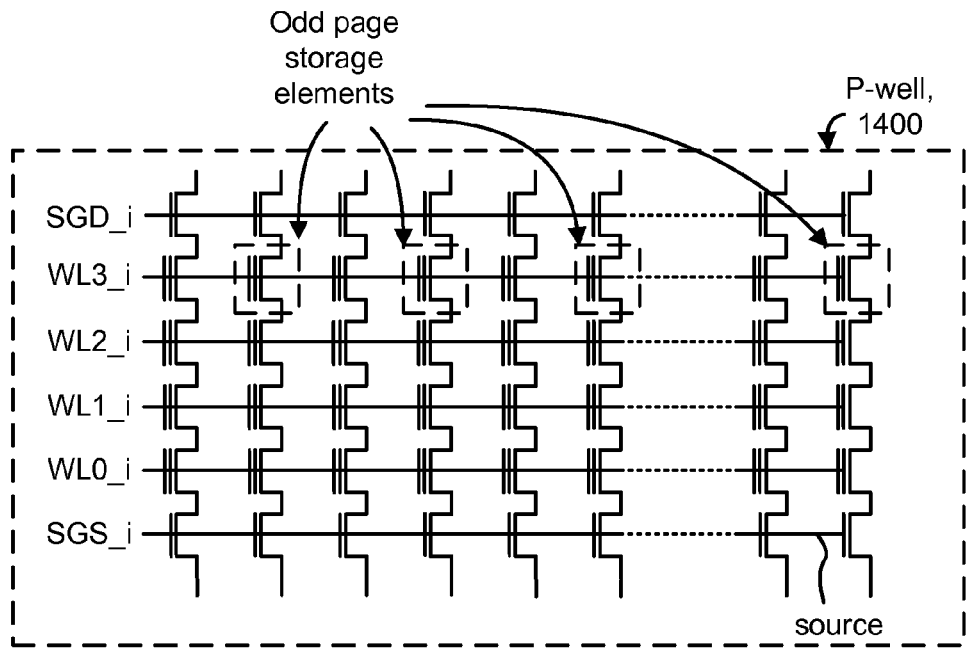
FIG. 14b depicts non-volatile storage in which a body bias is applied for storage elements associated with an odd page.

FIG. 14a depicts non-volatile storage in which a body bias is applied for storage elements associated with an even page. An ith block of storage elements is formed in a p-well 1400. The storage elements are arranged in NAND strings which extend vertically in the figure, while word lines WL0_i through WL3_i, which are in communication with the storage elements, and select gate lines SGS_i and SGD_i, extend horizontally. Here, alternate storage elements along a word line, e.g., WL3_i, store data for an even page. Thus, a particular body bias can be applied to the p-well 1400 when program, read or verify operations are performed involving data for this particular even page. Further, a different body bias can be applied to the p-well 1400 when program, read or verify operations are performed involving data for another particular even page, such as an even page involving WL2_i. Similarly, a different body bias can be applied when program, read or verify operations are performed involving data for an odd page involving WL3_i or other word line, as depicted by FIG. 14b. Specifically, FIG. 14b depicts non-volatile storage in which a body bias is applied for storage elements associated with an odd page. Alternate storage elements along a word line, e.g., WL3_i, store data for an odd page. Thus, a particular body bias can be applied to the p-well 1400 when program, read or verify operations are performed involving data for this particular odd page.

The above-described process is summarized in FIG. 15, which depicts a process for operating non-volatile storage in which separate body biases are applied at the chip, plane, block and/or page level. Step 1500 includes beginning a program, read or verify operation. Step 1502 includes reading a memory to obtain desired body bias levels for one or more chips, planes, blocks and/or pages. For example, the different body bias values can be retrieved from a table or other data structure. In one possible approach, the different body bias values are stored in non-volatile storage elements associated with the one or more chips, planes, blocks and/or pages. Step 1505 includes setting body bias levels for one or more chips, planes, blocks and/or pages involved in the operations, based on the desired body bias levels. Step 1510 includes applying the biases. For example, this can involve applying voltages to the p-well and n-well of the substrate (step 1515), applying voltages to the p-well while grounding the n-well (step 1520)

and/or grounding the body and applying voltages to the source and/or drain sides of the different sets of storage elements, e.g., at the chip, plane, block and/or page level (step 1525). At step 1530, the program, read or verify operation is performed and, at step 1535, the program, read or verify operation ends.

The process thus includes performing operations on non-volatile storage elements in different sets of non-volatile storage elements, where the different sets of non-volatile storage elements are formed on different portions of a substrate, and biasing the different portions of the substrate separately while the operations are performed. For example, the different sets of non-volatile storage elements can be in different planes of a chip, where each plane includes multiple blocks, and each block is erasable as a unit. In another approach, the different sets of non-volatile storage elements are in different blocks, where each block is erasable as a unit. In another approach, the different sets of non-volatile storage elements are in different pages, and each page is programmed as a unit. At least two different portions of the substrate can be biased at different bias levels. Further, the different portions of the substrate can be biased separately and concurrently.

Figure 16:
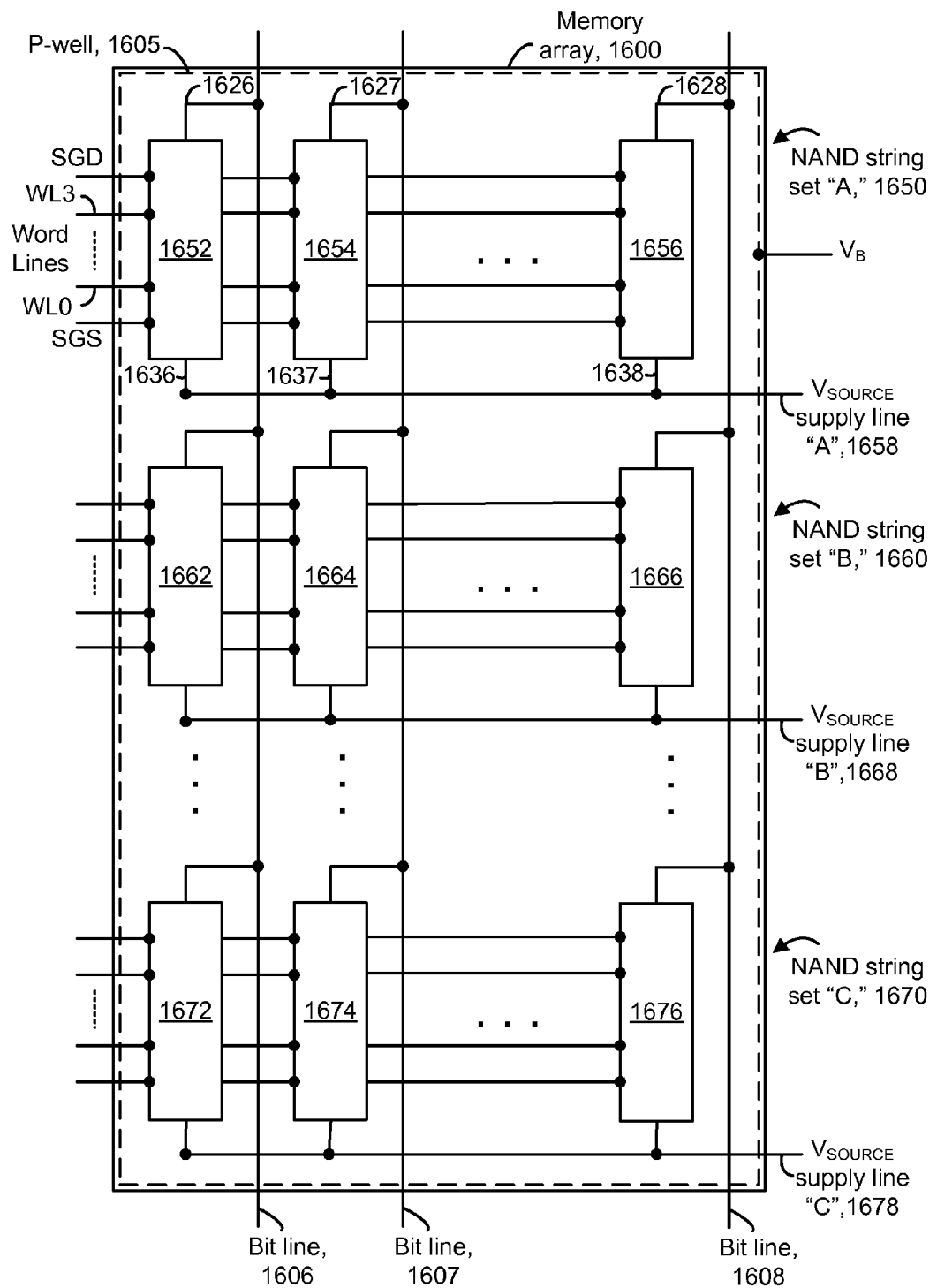
FIG. 16 depicts an example of an array of storage elements, including different sets of NAND strings.

FIG. 16 depicts an example of an array or plane of storage elements, including different sets of NAND strings. Generally, the energy consumed by applying a body bias can be reduced by having multiple p-wells in a plane or splitting the source wiring mesh into multiple "mini-meshes." Multiple p-wells in a plane reduce the time consumption/capacitive load involved with charging/discharging the body and also the forward bias diode current of the body/source junctions, but this happens at the expense of chip area. Another approach which can reduce energy consumption involves maintaining a common p-well while splitting the source mesh into multiple "mini-meshes" and floating the sources of the unused "mini-meshes" to reduce the forward bias diode current of the source/body junction of selected storage elements of the array. This can be advantageous even if source resistance increases. A mini-mesh can include a set of NAND strings.

For example, the memory array 1600 includes NAND string set "A" 1650, having NAND strings 1652, 1654, . . . , 1656, NAND string set "B" 1660, having NAND strings 1662, 1664, . . . , 1666, and NAND string set "C" 1670, having NAND strings 1672, 1674, . . . , 1676, all formed in p-well 1605. Along each column, bit lines are coupled to the drain terminals respectively, of the drain select gates for the NAND strings. For example, for the NAND string set "A" 1650, bit lines 1606, 1607, . . . , 1608 are coupled to the drain terminals 1626, 1627, . . . , 1628, respectively, of the drain select gates for the NAND strings 1652, 1654, . . . , 1656. Further, along each row of NAND strings, a source voltage ($V_{SOURCE}$) supply line may connect all the source terminals of the source select gates of the NAND strings. For example, $V_{SOURCE}$ supply line "A" 1658 connects the source terminals 1636, 1637, . . . , 1638 of the source select gates of the NAND strings 1652, 1654, . . . , 1656. Similarly, $V_{SOURCE}$ supply line "B" 1668 connects the source terminals of the source select gates of the NAND strings 1662, 1664, . . . , 1666, and $V_{SOURCE}$ supply line "C" 1678 connects the source terminals of the source select gates of the NAND strings 1672, 1674, . . . , 1676. Further details regarding an example of a NAND architecture array and its operation as part of a memory system is found in U.S. Pat. Nos. 5,570,315; 5,774,397; and 6,046,935.

Figure 17:
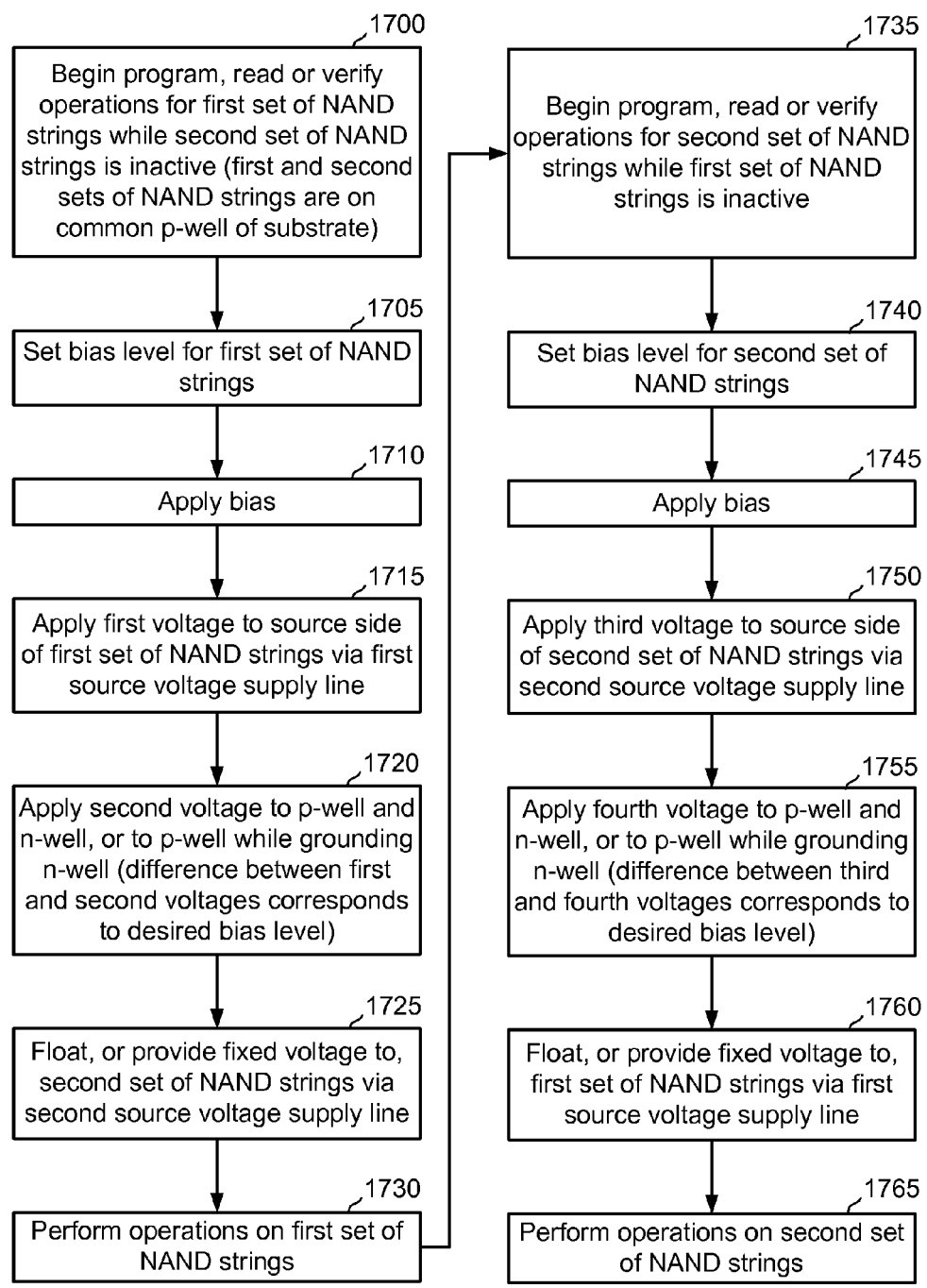
FIG. 17 depicts a process for operating non-volatile storage in which different body biases are applied to different sets of NAND strings.

The above-described process is summarized in FIG. 17, which depicts a process for operating non-volatile storage in which different body biases are applied to different sets of NAND strings. Step 1700 includes beginning program, read or verify operations for a first set of NAND strings (e.g., NAND string set "A" 1650 in FIG. 16) while at least a second set of NAND strings (e.g., NAND string set "B" 1660 and "C" 1670 in FIG. 16) is inactive or unused, e.g., program, read or verify operations are not being conducted on the second set of NAND strings. The first and second sets of NAND strings are on a common p-well of a substrate. Step 1705 includes setting a bias level for the first set of NAND strings, and step 1710 includes applying the bias. This can be achieved by applying a first voltage ($V_{SOURCE}$) to the source side of the first set of NAND strings via a first source voltage supply line, e.g., line 1658 (step 1715). Step 1720 includes applying a second voltage ($V_B$) to the p-well and n-well, or to the p-well while grounding the n-well, where a difference between first and second voltages is based on a desired bias level ($V_{BS}$). Step 1725 includes floating, or providing a fixed voltage to, the second set of NAND strings via a second source voltage supply line (e.g., line 1668). As a result, little p-n junction current flows between the source and the body for the non-volatile storage elements in the second set of NAND strings, so energy consumption is reduced. As a further example, if NAND string set "C" 1670 is inactive, the third set of NAND strings can float or receive a fixed voltage via the source voltage supply line "C" 1678.

Moreover, the fixed voltage can be set based on the bias level for the first set of NAND strings. For example, one implementation is: $V_B$=0.4 V, $V_{SOURCE}$=0 V (for set A) and $V_{SOURCE}$ (for set B)=0.4 V. In this case, $V_{SOURCE}$ (for set B)=$V_B$, the second voltage which is applied to the p-well and n-well, or to the p-well while grounding the n-well. Essentially, the $V_{SOURCE}$ for the unused set of NAND strings counteracts the applied body bias. Note also that steps 1715, 1720 and 1725 can be performed at the same time, in one approach. At step 1730, the operations are performed on the first set of NAND strings, e.g., to one or more non-volatile storage elements in the first set of NAND strings.

Once operations involving the first set of NAND strings are completed, program, read or verify operations for the second set of NAND strings can begin while the first set of NAND strings is inactive (step 1735). Step 1740 includes setting a bias level for the second set of NAND strings, and step 1745 includes applying the bias. Note that the body bias can be the same or different for the different sets of NAND strings. Step 1750 includes applying a third voltage ($V_{SOURCE}$) to the source side of the second set of NAND strings via a second source voltage supply line, e.g., line 1668 (FIG. 16). Step 1755 includes applying a fourth voltage ($V_B$) to the p-well and n-well, or to the p-well while grounding the n-well, where a difference between third and fourth voltages is based on a desired bias level ($V_{BS}$). Step 1760 includes floating, or providing a fixed voltage to, the first set of NAND strings via the first source voltage supply line (e.g., line 1658). Note that steps 1750, 1755 and 1760 can be performed at the same time, in one approach. At step 1765, the operations are performed on the second set of NAND strings, e.g., to one or more non-volatile storage elements in the second set of NAND strings.

Figure 18:
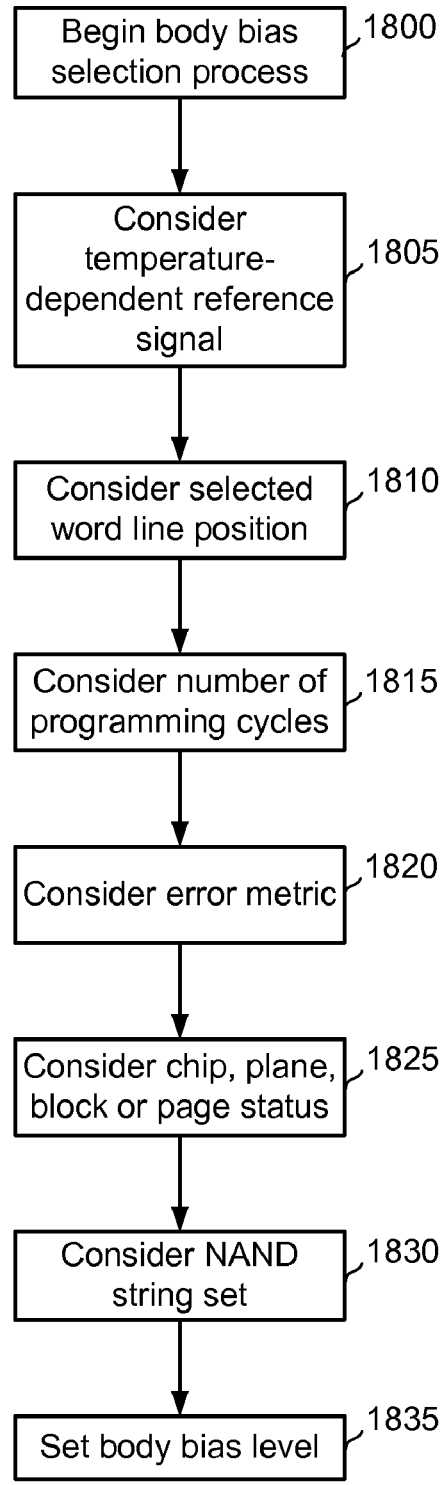
FIG. 18 depicts a process for setting a body bias level based on multiple factors.

FIG. 18 depicts a process for setting a body bias level based on multiple factors. As discussed, body bias can be used to address a number of different issues. The body bias can be set to address an individual issue, or to address multiple issues concurrently. For example, step 1800 includes beginning a body bias selection process. Step 1805 includes considering a temperature-dependent reference signal. Step 1810 includes considering a selected word line position. Step 1815 includes considering a number of programming cycles. Step 1820 includes considering an error metric. Step 1825 includes considering a chip, plane, block or page status involved in a program, read or verify operation. Step 1830 includes considering a NAND string set involved in a program, read or verify operation. Finally, step 1835 involves setting a body bias level. In some cases, different body bias levels would result from consideration of different factors alone, in which case an optimization can be performed to arrive at a final body bias level determination. For example, an average of the different body bias levels can be taken to arrive at the final body bias level. Or, the different body bias levels can be weighted based on the relative importance of the factor on which they are based. For instance, a body bias level based on temperature may be weighted as being more important than a body bias level based on selected word line position.

Figure 19:
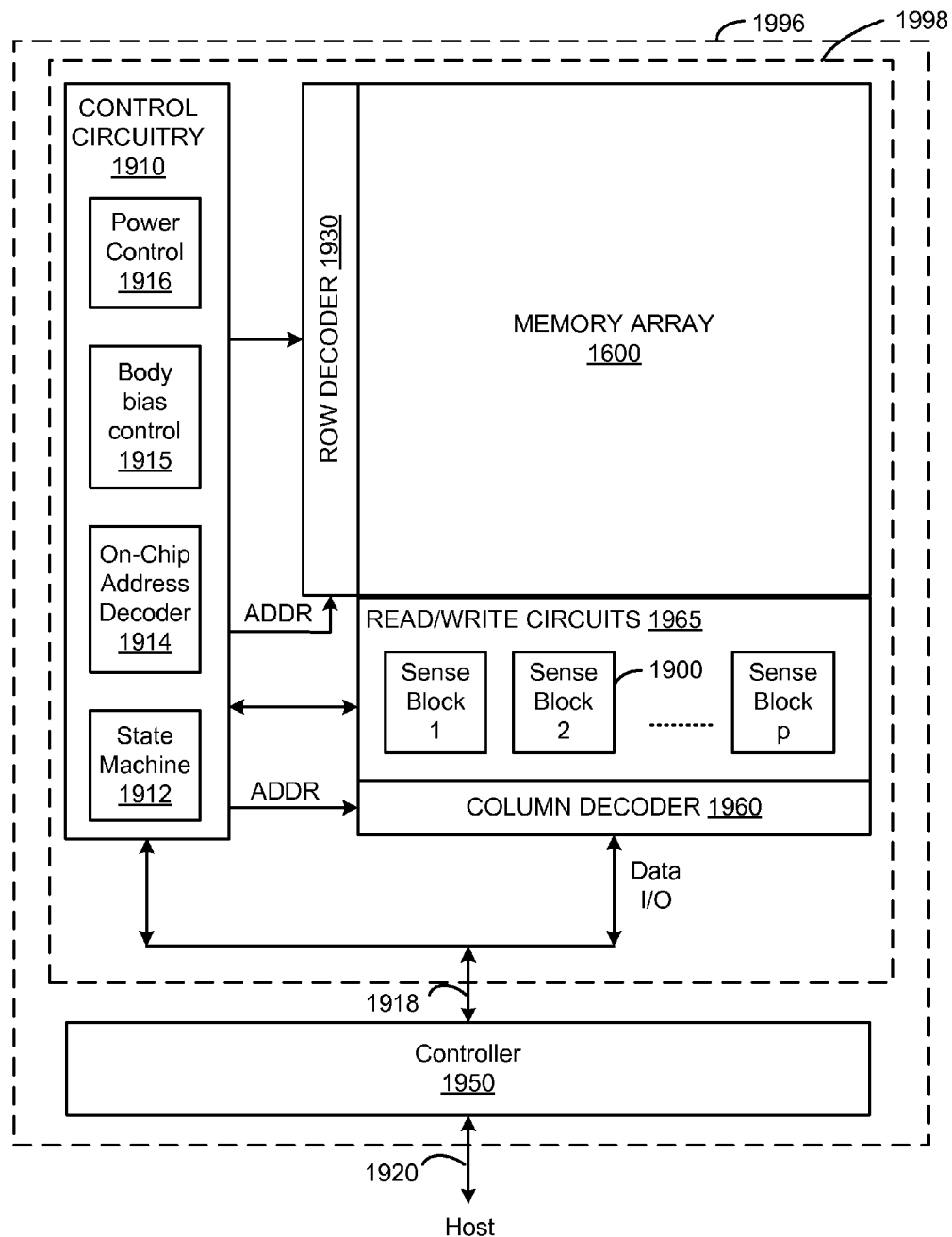
FIG. 19 is a block diagram of a non-volatile memory system using single row/column decoders and read/write circuits.

FIG. 19 is a block diagram of a non-volatile memory system using single row/column decoders and read/write circuits. The diagram depicts a memory device 1996 having read/write circuits for reading and programming a page of storage elements in parallel, according to one embodiment of the present invention. Memory device 1996 may include one or more memory die. One example of a memory die or chip 1998 includes a two-dimensional array of storage elements 1600, control circuitry 1910, and read/write circuits 1965. In some embodiments, the array of storage elements can be three dimensional. The memory array 1600 is addressable by word lines via a row decoder 1930 and by bit lines via a column decoder 1960. The read/write circuits 1965 include multiple sense blocks 1900 and allow a page of storage elements to be read or programmed in parallel. Typically a controller 1950 is included in the same memory device 1996 (e.g., a removable storage card) as the one or more memory die 1998. Commands and Data are transferred between the host and controller 1950 via lines 1920 and between the controller and the one or more memory die 1998 via lines 1918.

The control circuitry 1910 cooperates with the read/write circuits 1965 to perform memory operations on the memory array 1600. The control circuitry 1910 includes a state machine 1912, an on-chip address decoder 1914, a body bias control circuit 1915, and a power control module 1916. The body bias control circuit 1915 determines one or more body bias levels which are to be applied to the memory array 1600. The body bias level determination may be made based on various factors, as discussed previously. The state machine 1912 provides chip-level control of memory operations. The on-chip address decoder 1914 provides an address interface between that used by the host or a memory controller to the hardware address used by the decoders 1930 and 1960. The power control module 1916 controls the power and voltages supplied to the word lines and bit lines during memory operations.

In some implementations, some of the components of FIG. 19 can be combined. In various designs, one or more of the components (alone or in combination), other than storage element array 1600, can be thought of as a managing circuit. For example, one or more managing circuits may include any one of or a combination of control circuitry 1910, state machine 1912, decoders 1914/1960, power control 1916, sense blocks 1900, read/write circuits 1965, controller 1950, etc.

Figure 20:
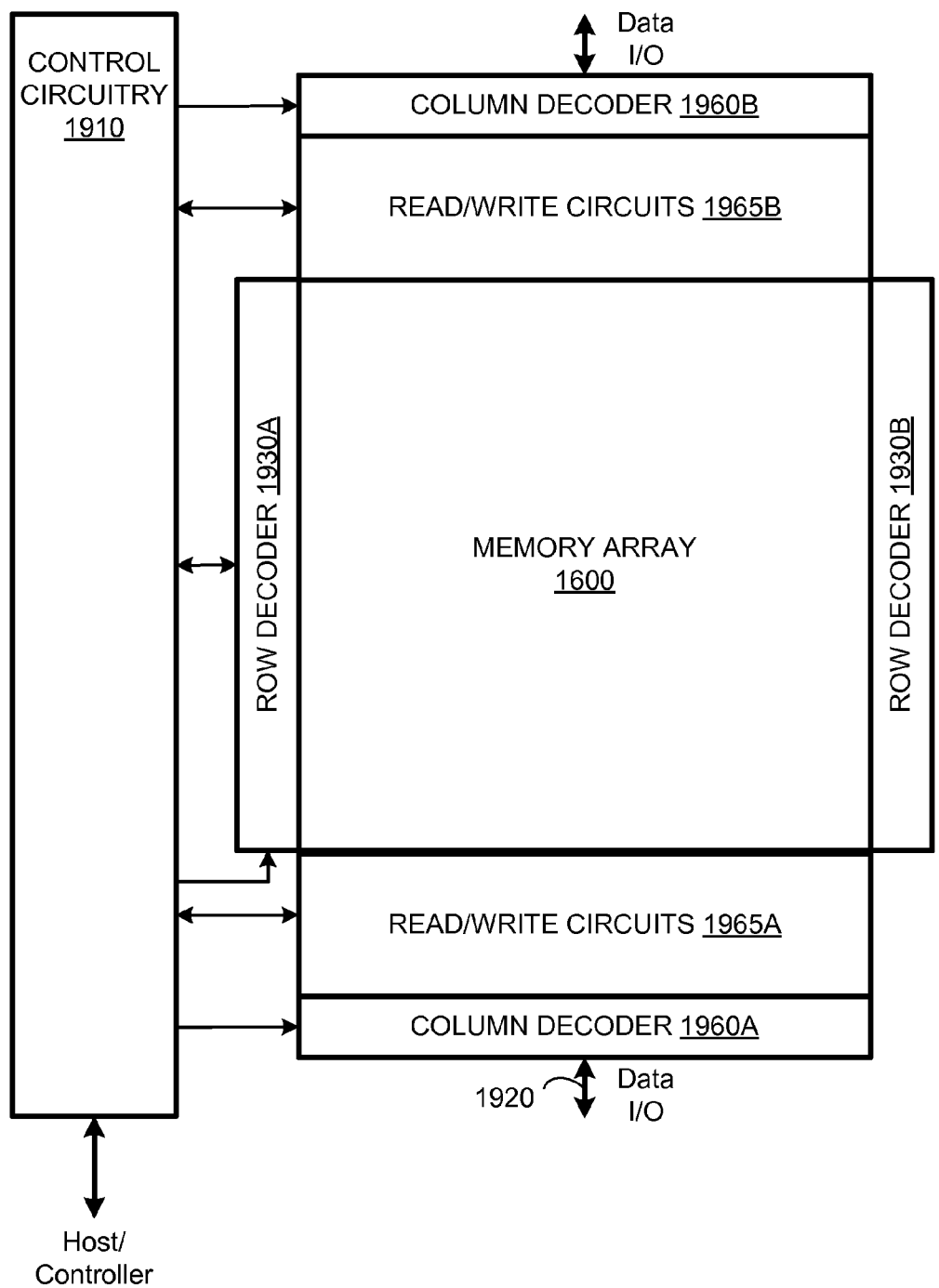
FIG. 20 is a block diagram of a non-volatile memory system using dual row/column decoders and read/write circuits.

FIG. 20 is a block diagram of a non-volatile memory system using dual row/column decoders and read/write circuits. Here, another arrangement of the memory device 1996 shown in FIG. 19 is provided. Access to the memory array 1600 by the various peripheral circuits is implemented in a symmetric fashion, on opposite sides of the array, so that the densities of access lines and circuitry on each side are reduced by half. Thus, the row decoder is split into row decoders 1930A and 1930B and the column decoder into column decoders 1960A and 1960B. Similarly, the read/write circuits are split into read/write circuits 1965A connecting to bit lines from the bottom and read/write circuits 1965B connecting to bit lines from the top of the array 1600. In this way, the density of the read/write modules is essentially reduced by one half. The device can also include a controller, as described above for the device of FIG. 19.

Figure 21:
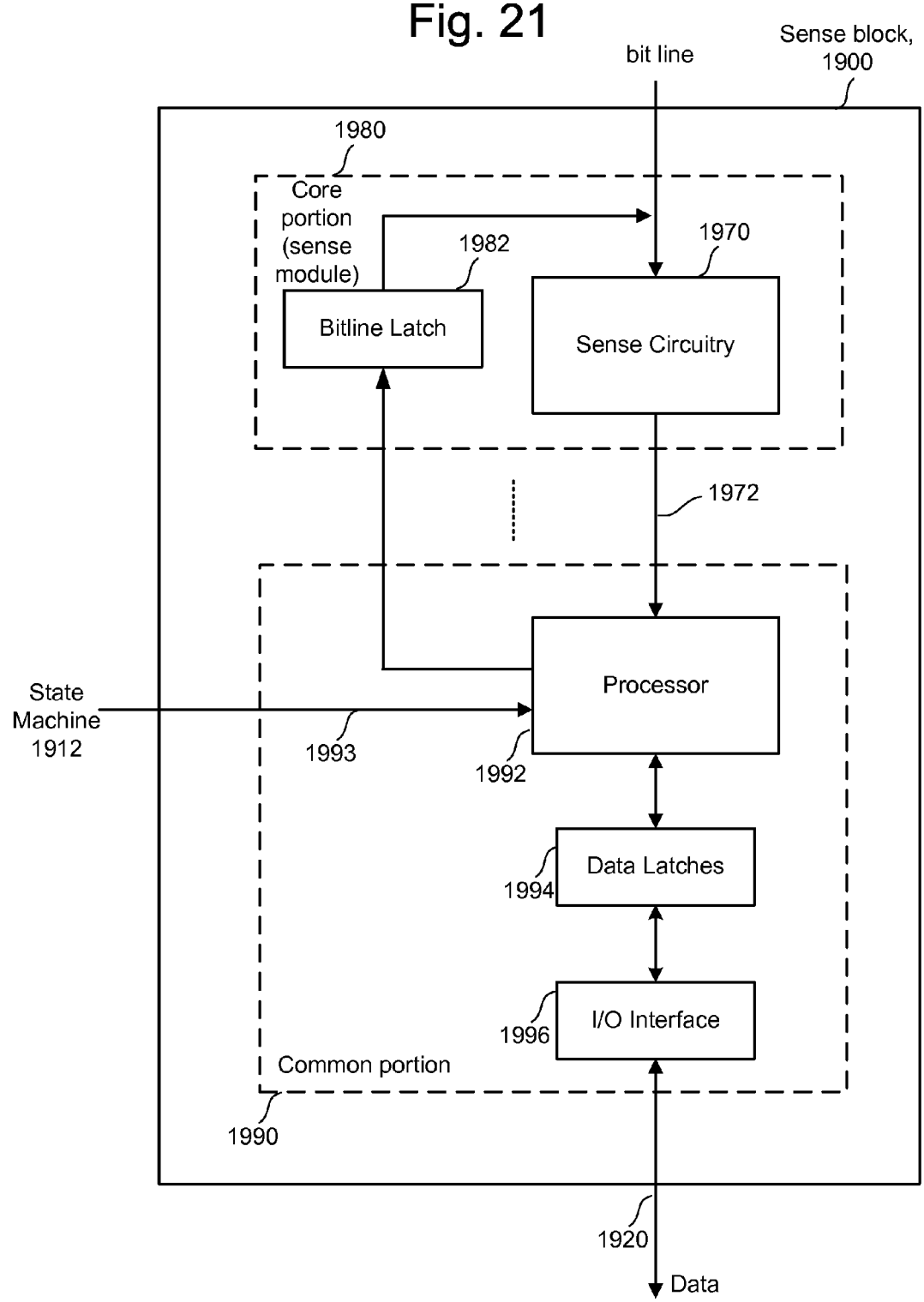
FIG. 21 is a block diagram depicting one embodiment of a sense block.

FIG. 21 is a block diagram depicting one embodiment of the sense block 1900 of FIG. 19. A sense block is used to determine the programming condition of a non-volatile storage element. An individual sense block 1900 is partitioned into a core portion, referred to as a sense module 1980, and a common portion 1990. In one embodiment, there will be a separate sense module 1980 for each bit line and one common portion 1990 for a set of multiple sense modules 1980. In one example, a sense block will include one common portion 1990 and eight sense modules 1980. Each of the sense modules in a group will communicate with the associated common portion via a data bus 1972. For further details refer to U.S. Patent Application Pub No. 2006/0140007, titled "Non-Volatile Memory & Method with Shared Processing for an Aggregate of Sense Amplifiers" published Jun. 29, 2006, and incorporated herein by reference in its entirety.

Sense module 1980 comprises sense circuitry 1970 that determines whether a conduction current in a connected bit line is above or below a predetermined threshold level. Sense module 1980 also includes a bit line latch 1982 that is used to set a voltage condition on the connected bit line. For example, a predetermined state latched in bit line latch 1982 will result in the connected bit line being pulled to a state designating program inhibit (e.g., Vdd).

Common portion 1990 comprises a processor 1992, a set of data latches 1994 and an I/O Interface 1996 coupled between the set of data latches 1994 and data bus 1920. Processor 1992 performs computations. For example, one of its functions is to determine the data stored in the sensed storage element and store the determined data in the set of data latches. The set of data latches 1994 is used to store data bits determined by processor 1992 during a read operation. It is also used to store data bits imported from the data bus 1920 during a program operation. The imported data bits represent write data meant to be programmed into the memory. I/O interface 1996 provides an interface between data latches 1994 and the data bus 1920.

During read or sensing, the operation of the system is under the control of state machine 1912 that controls the supply of different control gate voltages to the addressed storage element. As it steps through the various predefined control gate voltages corresponding to the various memory states supported by the memory, the sense module 1980 may trip at one of these voltages and an output will be provided from sense module 1980 to processor 1992 via bus 1972. At that point, processor 1992 determines the resultant memory state by consideration of the tripping event(s) of the sense module and the information about the applied control gate voltage from the state machine via input lines 1993. It then computes a binary encoding for the memory state and stores the resultant data bits into data latches 1994. In another embodiment of the core portion, bit line latch 1982 serves double duty, both as a latch for latching the output of the sense module 1980 and also as a bit line latch as described above.

It is anticipated that some implementations will include multiple processors 1992. In one embodiment, each processor 1992 will include an output line (not depicted in FIG. 21) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 1992 to accumulate the results of the associated bit lines such that the state machine need only read the wired-OR line one time. Similarly, by choosing the logic levels correctly, the global state machine can detect when the first bit changes its state and change the algorithms accordingly.

During program or verify, the data to be programmed is stored in the set of data latches 1994 from the data bus 1920. The program operation, under the control of the state machine, comprises a series of programming voltage pulses applied to the control gates of the addressed storage elements. Each programming pulse is followed by a read back (verify) to determine if the storage element has been programmed to the desired memory state. Processor 1992 monitors the read back memory state relative to the desired memory state. When the two are in agreement, the processor 1992 sets the bit line latch 1982 so as to cause the bit line to be pulled to a state designating program inhibit. This inhibits the storage element coupled to the bit line from further programming even if programming pulses appear on its control gate. In other embodiments the processor initially loads the bit line latch 1982 and the sense circuitry sets it to an inhibit value during the verify process.

Data latch stack 1994 contains a stack of data latches corresponding to the sense module. In one embodiment, there are three data latches per sense module 1980. In some implementations (but not required), the data latches are implemented as a shift register so that the parallel data stored therein is converted to serial data for data bus 1920, and vice versa. In the preferred embodiment, all the data latches corresponding to the read/write block of m storage elements can be linked together to form a block shift register so that a block of data can be input or output by serial transfer. In particular, the bank of r read/write modules is adapted so that each of its set of data latches will shift data in to or out of the data bus in sequence as if they are part of a shift register for the entire read/write block.

Additional information about the structure and/or operations of various embodiments of non-volatile storage devices can be found in (1) U.S. Patent Application Pub. No. 2004/0057287, "Non-Volatile Memory And Method With Reduced Source Line Bias Errors," published on Mar. 25, 2004; (2) U.S. Patent Application Pub No. 2004/0109357, "Non-Volatile Memory And Method with Improved Sensing," published on Jun. 10, 2004; (3) U.S. Patent Application Ser. No. 11/015,199 titled "Improved Memory Sensing Circuit And Method For Low Voltage Operation," filed on Dec. 16, 2004; (4) U.S. patent application Ser. No. 11/099,133, titled "Compensating for Coupling During Read Operations of Non-Volatile Memory," filed on Apr. 5, 2005; and (5) U.S. patent application Ser. No. 11/321,953, titled "Reference Sense Amplifier For Non-Volatile Memory, filed on Dec. 28, 2005. All five of the immediately above-listed patent documents are incorporated herein by reference in their entirety.

Figure 22:
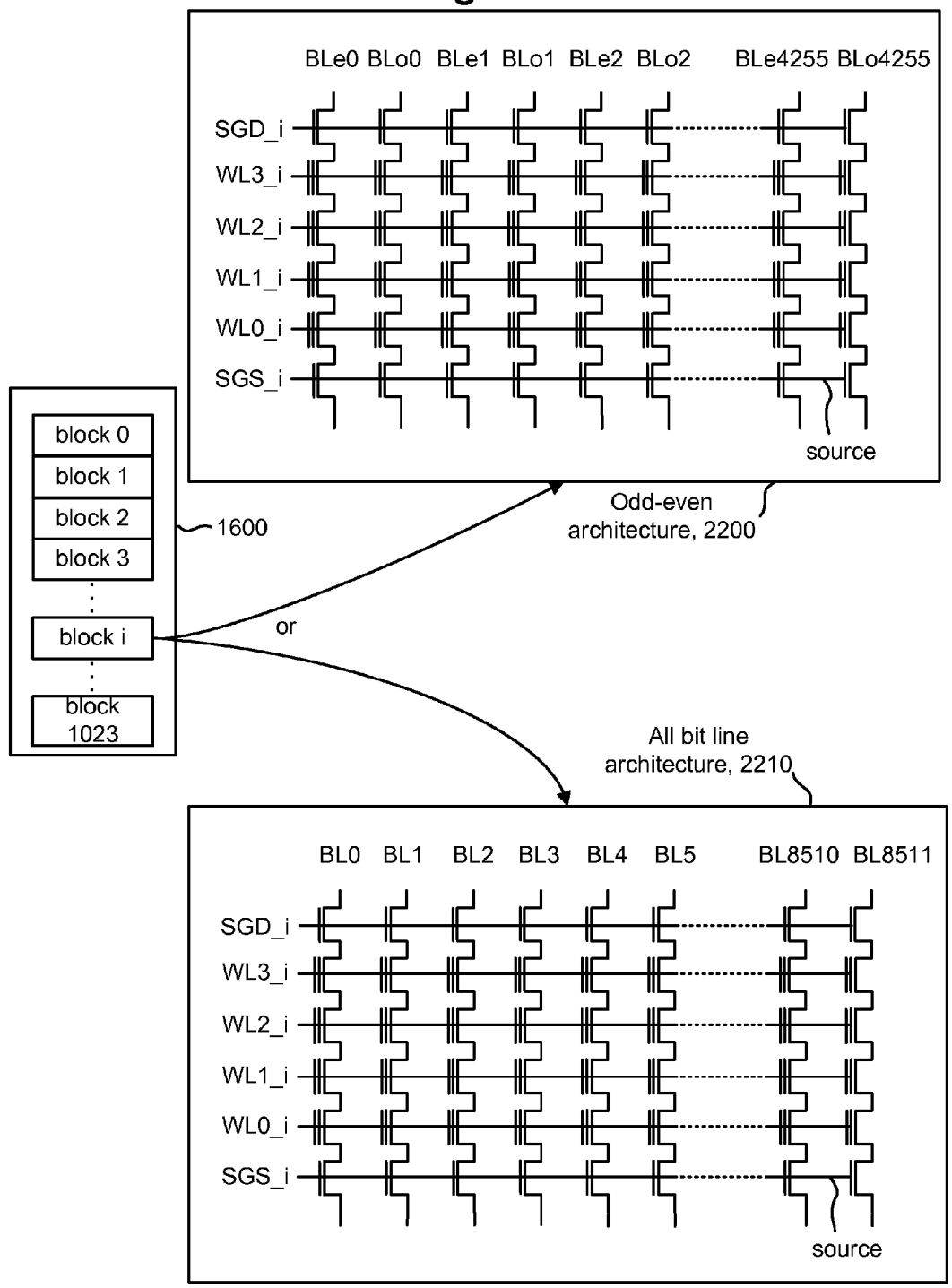
FIG. 22 depicts an example of an organization of a memory array into blocks for odd-even and all bit line memory architectures.

FIG. 22 depicts an example of an organization of a memory array into blocks for odd-even and all bit line memory architectures. Exemplary structures of the memory array 1600 of FIG. 16 are described. As one example, a NAND flash EEPROM is described that is partitioned into 1,024 blocks. The data stored in each block can be simultaneously erased. In one embodiment, the block is the minimum unit of storage elements that are simultaneously erased. In each block, in this example, there are 8,512 columns corresponding to bit lines BL0, BL1, . . . BL8511. In one embodiment referred to as an all bit line (ABL) architecture (architecture 2210), all the bit lines of a block can be simultaneously selected during read and program operations. Storage elements along a common word line and connected to any bit line can be programmed at the same time.

In the example provided, four storage elements are connected in series to form a NAND string. Although four storage elements are shown to be included in each NAND string, more or less than four can be used (e.g., 16, 32, 64 or another number). One terminal of the NAND string is connected to a corresponding bit line via a drain select gate (connected to select gate drain lines SGD), and another terminal is connected to c-source via a source select gate (connected to select gate source line SGS).

In another embodiment, referred to as an odd-even architecture (architecture 2200), the bit lines are divided into even bit lines (BLe) and odd bit lines (BLo). In the odd/even bit line architecture, storage elements along a common word line and connected to the odd bit lines are programmed at one time, while storage elements along a common word line and connected to even bit lines are programmed at another time. Data can be programmed into different blocks and read from different blocks concurrently. In each block, in this example, there are 8,512 columns that are divided into even columns and odd columns. In this example, four storage elements are shown connected in series to form a NAND string. Although four storage elements are shown to be included in each NAND string, more or fewer than four storage elements can be used.

During one configuration of read and programming operations, 4,256 storage elements are simultaneously selected. The storage elements selected have the same word line and the same kind of bit line (e.g., even or odd). Therefore, 532 bytes of data, which form a logical page, can be read or programmed simultaneously, and one block of the memory can store at least eight logical pages (four word lines, each with odd and even pages). For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and bit lines are floating. Erasing can be performed on the entire memory array, separate blocks, or another unit of the storage elements which is a portion of the memory device. Electrons are transferred from the floating gates of the storage elements to the p-well region so that the $V_{TH}$ of the storage elements becomes negative.

In the read and verify operations, the select gates (SGD and SGS) are connected to a voltage in a range of 2.5 to 4.5 V and the unselected word lines (e.g., WL0, WL1 and WL3, when WL2 is the selected word line) are raised to a read pass voltage, VREAD, (typically a voltage in the range of 4.5 to 6 V) to make the transistors operate as pass gates. The selected word line WL2 is connected to a voltage, a level of which is specified for each read and verify operation in order to determine whether a $V_{TH}$ of the concerned storage element is above or below such level. For example, in a read operation for a two-level storage element, the selected word line WL2 may be grounded, so that it is detected whether the $V_{TH}$ is higher than 0 V. In a verify operation for a two level storage element, the selected word line WL2 is connected to 0.8 V, for example, so that it is verified whether or not the $V_{TH}$ has reached at least 0.8 V. The source and p-well are at 0 V. The selected bit lines, assumed to be the even bit lines (BLe), are pre-charged to a level of, for example, 0.7 V. If the $V_{TH}$ is higher than the read or verify level on the word line, the potential level of the bit line (BLe) associated with the storage element of interest maintains the high level because of the non-conductive storage element. On the other hand, if the $V_{TH}$ is lower than the read or verify level, the potential level of the concerned bit line (BLe) decreases to a low level, for example, less than 0.5 V, because the conductive storage element discharges the bit line. The state of the storage element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

Figure 23:
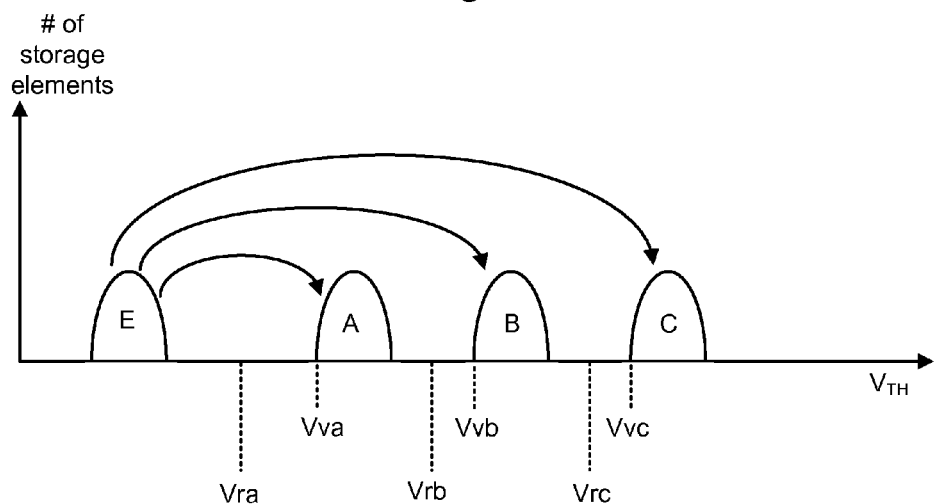
FIG. 23 depicts an example set of threshold voltage distributions.

FIG. 23 depicts an example set of threshold voltage distributions. Example $V_{TH}$ distributions for the storage element array are provided for a case where each storage element stores two bits of data. A first threshold voltage distribution E is provided for erased storage elements. Three threshold voltage distributions, A, B and C for programmed storage elements, are also depicted. In one embodiment, the threshold voltages in the E distribution are negative and the threshold voltages in the A, B and C distributions are positive.

Each distinct threshold voltage range corresponds to predetermined values for the set of data bits. The specific relationship between the data programmed into the storage element and the threshold voltage levels of the storage element depends upon the data encoding scheme adopted for the storage elements. For example, U.S. Pat. No. 6,222,762 and U.S. Patent Application Publication No. 2004/0255090, published Dec. 16, 2004, both of which are incorporated herein by reference in their entirety, describe various data encoding schemes for multi-state flash storage elements. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although four states are shown, the present invention can also be used with other multi-state structures including those that include more or less than four states.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to state A, the system will test whether those storage elements have a threshold voltage greater than or equal to Vva. When programming storage elements to state B, the system will test whether the storage elements have threshold voltages greater than or equal to Vvb. When programming storage elements to state C, the system will determine whether storage elements have their threshold voltage greater than or equal to Vvc.

In one embodiment, known as full sequence programming, storage elements can be programmed from the erase state E directly to any of the programmed states A, B or C. For example, a population of storage elements to be programmed may first be erased so that all storage elements in the population are in erased state E. A series of programming pulses such as depicted by the pulse train of FIG. 27 will then be used to program storage elements directly into states A, B or C. While some storage elements are being programmed from state E to state A, other storage elements are being programmed from state E to state B and/or from state E to state C. When programming from state E to state C on WLn, the amount of parasitic coupling to the adjacent floating gate under WLn-1 is a maximized since the change in amount of charge on the floating gate under WLn is largest as compared to the change in voltage when programming from state E to state A or state E to state B. When programming from state E to state B the amount of coupling to the adjacent floating gate is reduced but still significant. When programming from state E to state A the amount of coupling is reduced even further. Consequently the amount of correction required to subsequently read each state of WLn-1 will vary depending on the state of the adjacent storage element on WLn.

Figure 24:
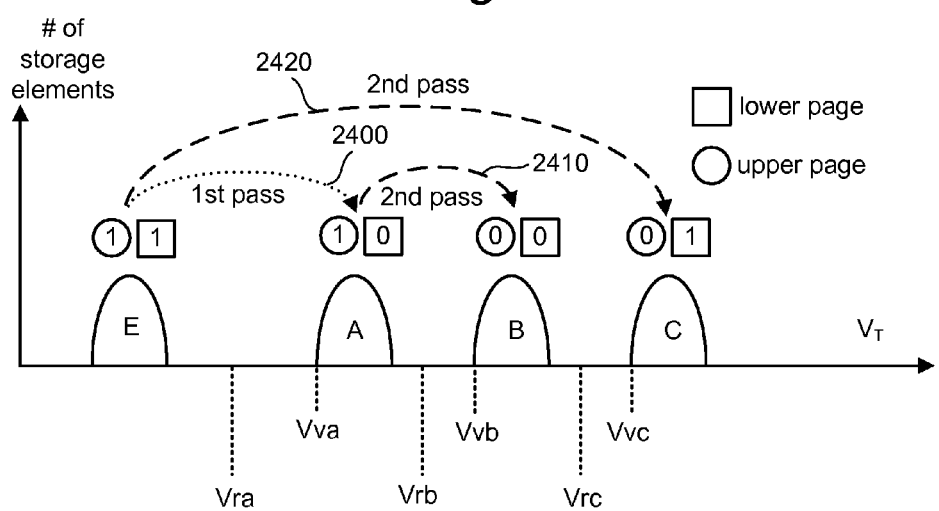
FIG. 24 depicts an example of a two-pass technique of programming a multi-state storage element that stores data for two different pages: a lower page and an upper page.

FIG. 24 depicts an example of a two-pass technique of programming a multi-state storage element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned.

In a first programming pass, the storage element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the storage element is increased to be state A, as shown by arrow 2400. That concludes the first programming pass.

In a second programming pass, the storage element's threshold voltage level is set according to the bit being programmed into the upper logical page. If the upper logical page bit is to store a logic "1," then no programming occurs since the storage element is in one of the states E or A, depending upon the programming of the lower page bit, both of which carry an upper page bit of "1." If the upper page bit is to be a logic "0," then the threshold voltage is shifted. If the first pass resulted in the storage element remaining in the erased state E, then in the second phase the storage element is programmed so that the threshold voltage is increased to be within state C, as depicted by arrow 2420. If the storage element had been programmed into state A as a result of the first programming pass, then the storage element is further programmed in the second pass so that the threshold voltage is increased to be within state B, as depicted by arrow 2410. The result of the second pass is to program the storage element into the state designated to store a logic "0" for the upper page without changing the data for the lower page. In both FIG. 23 and FIG. 24 the amount of coupling to the floating gate on the adjacent word line depends on the final state.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's storage elements. More details of such an embodiment are disclosed in U.S. Patent Application Pub. No. 2006/0126390, titled "Pipelined Programming of Non-Volatile Memories Using Early Data," published Jun. 15, 2006, incorporated herein by reference in its entirety.

Figure 25A:
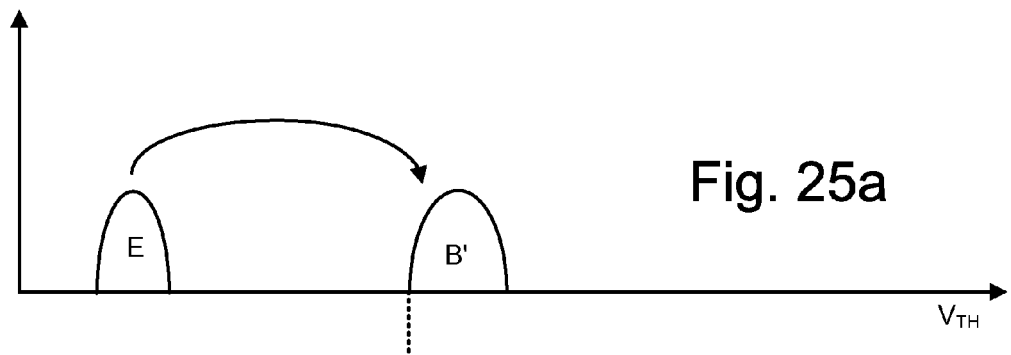
FIGS. 25a-c show various threshold voltage distributions and describe a process for programming non-volatile memory.
Figure 25B:
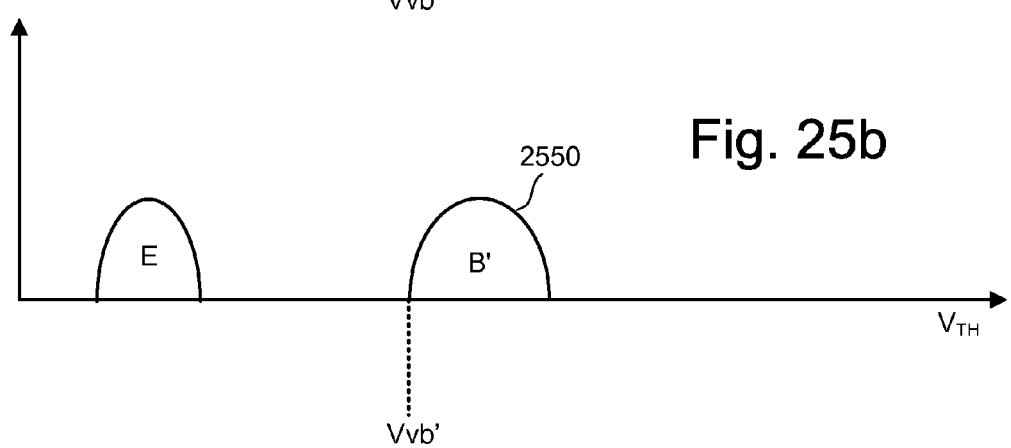
Figure 25C:
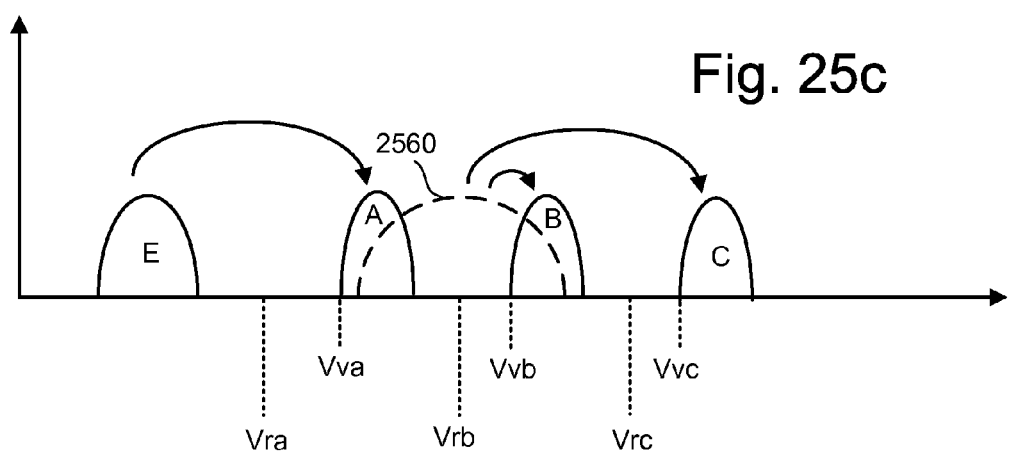

FIGS. 25a-c disclose another process for programming non-volatile memory that reduces the effect of floating gate to floating gate coupling by, for any particular storage element, writing to that particular storage element with respect to a particular page subsequent to writing to adjacent storage elements for previous pages. In one example implementation, the non-volatile storage elements store two bits of data per storage element, using four data states. For example, assume that state E is the erased state and states A, B and C are the programmed states. State E stores data 11. State A stores data 01. State B stores data 10. State C stores data 00. This is an example of non-Gray coding because both bits change between adjacent states A and B. Other encodings of data to physical data states can also be used. Each storage element stores two pages of data. For reference purposes, these pages of data will be called upper page and lower page; however, they can be given other labels. With reference to state A, the upper page stores bit 0 and the lower page stores bit 1. With reference to state B, the upper page stores bit 1 and the lower page stores bit 0. With reference to state C, both pages store bit data 0.

The programming process is a two-step process. In the first step, the lower page is programmed. If the lower page is to remain data 1, then the storage element state remains at state E. If the data is to be programmed to 0, then the threshold of voltage of the storage element is raised such that the storage element is programmed to state B'. FIG. 25a therefore shows the programming of storage elements from state E to state B'. State B' is an interim state B; therefore, the verify point is depicted as Vvb', which is lower than Vvb.

In one embodiment, after a storage element is programmed from state E to state B', its neighbor storage element (WLn+1) in the NAND string will then be programmed with respect to its lower page. For example, looking back at FIG. 2, after the lower page for storage element 106 is programmed, the lower page for storage element 104 would be programmed. After programming storage element 104, the floating gate to floating gate coupling effect will raise the apparent threshold voltage of storage element 106 if storage element 104 had a threshold voltage raised from state E to state B'. This will have the effect of widening the threshold voltage distribution for state B' to that depicted as threshold voltage distribution 2550 of FIG. 25b. This apparent widening of the threshold voltage distribution will be remedied when programming the upper page.

FIG. 25c depicts the process of programming the upper page. If the storage element is in erased state E and the upper page is to remain at 1, then the storage element will remain in state E. If the storage element is in state E and its upper page data is to be programmed to 0, then the threshold voltage of the storage element will be raised so that the storage element is in state A. If the storage element was in intermediate threshold voltage distribution 2560, which is widened relative to distribution 2550, and the upper page data is to remain at 1, then the storage element will be programmed to final state B.

If the storage element is in intermediate threshold voltage distribution 2560 and the upper page data is to become data 0, then the threshold voltage of the storage element will be raised so that the storage element is in state C. The process depicted by FIGS. 25a-c reduces the effect of floating gate to floating gate coupling because only the upper page programming of neighbor storage elements will have an effect on the apparent threshold voltage of a given storage element. An example of an alternate state coding is to move from distribution 2560 to state C when the upper page data is a 1, and to move to state B when the upper page data is a 0.

Although FIGS. 25a-c provide an example with respect to four data states and two pages of data, the concepts taught can be applied to other implementations with more or fewer than four states and different than two pages.

Figure 26:
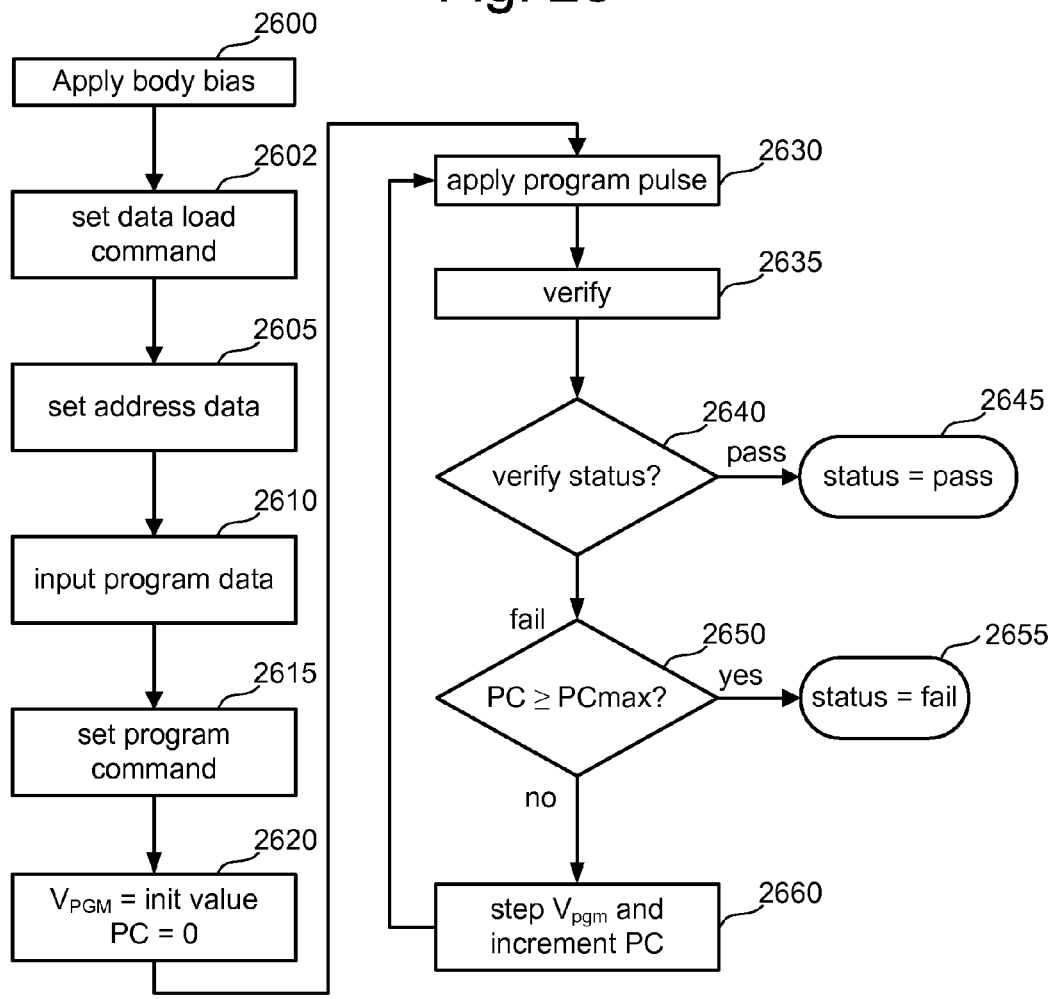
FIG. 26 is a flow chart describing one embodiment of a method for programming non-volatile memory.

FIG. 26 is a flow chart describing one embodiment of a method for programming non-volatile memory. In one implementation, storage elements are erased (in blocks or other units) prior to programming. In step 2600, a body bias is applied, as discussed previously. In step 2602, a "data load" command is issued by the controller and input received by control circuitry 1910. In step 2605, address data designating the page address is input to decoder 1914 from the controller or host. In step 2610, a page of program data for the addressed page is input to a data buffer for programming. That data is latched in the appropriate set of latches. In step 2615, a "program" command is issued by the controller to state machine 1912.

Figure 27:
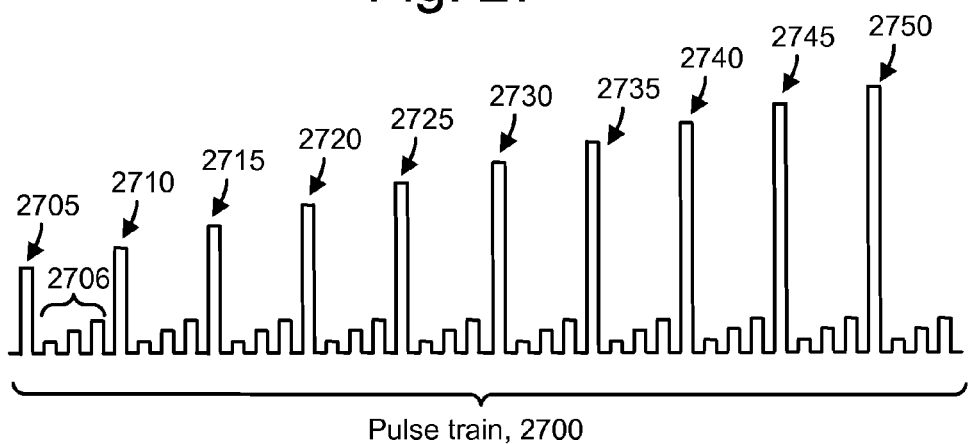
FIG. 27 depicts an example pulse train applied to the control gates of non-volatile storage elements during programming.

Triggered by the "program" command, the data latched in step 2610 will be programmed into the selected storage elements controlled by state machine 1912 using the stepped program pulses 2705, 2710, 2715, 2720, 2725, 2730, 2735, 2740, 2745, 2750, . . . of the pulse train 2700 of FIG. 27 applied to the appropriate selected word line. In step 2620, the program voltage, VPGM, is initialized to the starting pulse (e.g., 12 V or other value) and a program counter (PC) maintained by state machine 1912 is initialized at zero. In step 2630, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to Vdd to inhibit programming.

In step 2635, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine (via the wired-OR type mechanism described above) knows that all selected storage elements have been programmed. In step 2640, a check is made as to whether all of the data latches are storing logic "1." If all of the data latches are storing logic "1," the programming process is complete and successful because all selected storage elements were programmed and verified. A status of "PASS" is reported in step 2645.

If, in step 2640, it is determined that not all of the data latches are storing logic "1," then the programming process continues. In step 2650, the program counter PC is checked against a program limit value PCmax. One example of a program limit value is twenty; however, other numbers can also be used. If the program counter PC is not less than PCmax, then the program process has failed and a status of "FAIL" is reported in step 2655. If the program counter PC is less than PCmax, then $V_{PGM}$ is increased by the step size and the program counter PC is incremented in step 2660. The process loops back to step 2630 to apply the next $V_{PGM}$ pulse.

In some situations, as discussed, the body bias level can be varied during programming. For example, a body bias which is set based on a selected word line position can be varied as the selected word line changes during programming.

FIG. 27 depicts an example pulse train 2700 applied to the control gates of non-volatile storage elements during programming. The pulse train 2700 includes a series of program pulses 2705, 2710, 2715, 2720, 2725, 2730, 2735, 2740, 2745, 2750, ..., that are applied to a word line selected for programming. In one embodiment, the programming pulses have a voltage, $V_{PGM}$, which starts at 12 V and increases by increments, e.g., 0.5 V, for each successive programming pulse until a maximum of 20 V is reached. In between the program pulses are verify pulses. For example, verify pulse set 2706 includes three verify pulses. In some embodiments, there can be a verify pulse for each state that data is being programmed into, e.g., state A, B and C. In other embodiments, there can be more or fewer verify pulses. The verify pulses in each set can have amplitudes of Vva, Vvb and Vvc (FIG. 24) or Vvb' (FIG. 25*a*), for instance.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A non-volatile storage system, comprising:
at least one set of non-volatile storage elements formed, at least in part, on a substrate; and
one or more control circuits in communication with the at least one set of non-volatile storage elements, the one or more control circuits read multi-bit coded data from non-volatile storage elements in the at least one set of non-volatile storage elements while biasing a substrate at a first bias level, decode the multi-bit coded data to obtain a count of bit errors, and, if the count exceeds a threshold, determine a second bias level for biasing the substrate when performing a subsequent read of non-volatile storage elements in the at least one set of non-volatile storage elements.

2. The non-volatile storage system of claim 1, wherein:
if the count does not exceed the threshold, the one or more control circuits bias the substrate at the first bias level when performing the subsequent read of non-volatile storage elements in the at least one set of non-volatile storage elements.

3. The non-volatile storage system of claim 1, wherein:
the count is determined based on reading non-volatile storage elements in a plurality of sets of non-volatile storage elements which are formed, at least in part, on the substrate, the count is determined based on counts which are determined for each of the sets.

4. The non-volatile storage system of claim 1, wherein:
the count is determined based on multiple read operations performed on non-volatile storage elements in the at least one set of non-volatile storage elements.

5. The non-volatile storage system of claim 1, wherein:
the at least one set of non-volatile storage elements is provided in at least one NAND string which is formed, at least in part, on the substrate.

6. The non-volatile storage system of claim 1, wherein:
the one or more control circuits bias the substrate by applying a voltage based on the first bias level to the substrate.

7. The non-volatile storage system of claim 1, wherein:
the count is for a page of data stored by the at least one set of non-volatile storage elements.

8. The non-volatile storage system of claim 1, wherein:
the second bias level is in linear proportion to the count.

9. The non-volatile storage system of claim 1, wherein:
the second bias level is in non-linear proportion to the count.

10. The non-volatile storage system of claim 1, wherein:
the one or more control circuits decode the multi-bit coded data by detecting but not correcting errors.

11. The non-volatile storage system of claim 1, wherein:
the one or more control circuits decode the multi-bit coded data by detecting and correcting errors.

12. The non-volatile storage system of claim 11, wherein:
the count includes all detected errors, including those which can be corrected and those which cannot be corrected.

13. The non-volatile storage system of claim 11, wherein:
the count includes errors which cannot be corrected but not errors which can be corrected.

14. A non-volatile storage system, comprising:
at least one set of non-volatile storage elements formed, at least in part, on a substrate; and
one or more control circuits in communication with the at least one set of non-volatile storage elements, the one or more control circuits read non-volatile storage elements in the at least one set of non-volatile storage elements while biasing a substrate at a first bias level, and, based on the read, determine a first error metric, and, if the first error metric exceeds a threshold, determine a second bias level for biasing the substrate when performing a subsequent read of non-volatile storage elements in the at least one set of non-volatile storage elements;
the one or more control circuits read non-volatile storage elements in the at least one set of non-volatile storage elements while biasing the substrate at the second bias level, and, determine a second error metric, based on the reading while biasing the substrate at the second bias level, and, if the second error metric exceeds the threshold, determine a third bias level for biasing the substrate when performing a subsequent read of non-volatile storage elements in the at least one set of non-volatile storage elements;
the second bias level is lower than the first bias level; and
the third bias level is higher than the first bias level if the second error metric indicates more errors than the first error metric.

15. The non-volatile storage system of claim 14, wherein:
the first error metric is determined using error correction code decoding.

16. The non-volatile storage system of claim 14, wherein:
the first error metric is determined using error detection code decoding.

17. The non-volatile storage system of claim 14, wherein:
the non-volatile storage elements store multi-bit data.

18. A non-volatile storage system, comprising:
at least one set of non-volatile storage elements formed, at least in part, on a substrate; and
one or more control circuits in communication with the at least one set of non-volatile storage elements, the one or more control circuits read non-volatile storage elements in the at least one set of non-volatile storage elements while biasing a substrate at a first bias level, and, based on the read, determine a first error metric, and, if the first error metric exceeds a threshold, determine a second bias level for biasing the substrate when performing a subsequent read of non-volatile storage elements in the at least one set of non-volatile storage elements;
the one or more control circuits read non-volatile storage elements in the at least one set of non-volatile storage elements while biasing the substrate at the second bias level, and, determine a second error metric, based on the reading while biasing the substrate at the second bias level, and, if the second error metric exceeds the threshold, determine a third bias level for biasing the substrate when performing a subsequent read of non-volatile storage elements in the at least one set of non-volatile storage elements;
the second bias level is higher than the first bias level; and
the third bias level is lower than the first bias level if the second error metric indicates more errors than the first error metric.

19. The non-volatile storage system of claim 18, wherein:
the first error metric is determined using error correction code decoding.

20. The non-volatile storage system of claim 18, wherein:
the first error metric is determined using error detection code decoding.

21. The non-volatile storage system of claim 18, wherein:
the non-volatile storage elements store multi-bit data.

22. A non-volatile storage system, comprising:
at least one set of non-volatile storage elements formed, at least in part, on a substrate; and one or more control circuits in communication with the at least one set of non-volatile storage elements, the one or more control circuits read non-volatile storage elements in the at least one set of non-volatile storage elements while biasing a substrate at a first bias level, and, based on the read, determine a first error metric, and, if the first error metric exceeds a threshold, determine a second bias level for biasing the substrate when performing a subsequent read of non-volatile storage elements in the at least one set of non-volatile storage elements;
the one or more control circuits bias the substrate by applying a first voltage to the substrate, and applying a second voltage to at least one of a source of the set of non-volatile storage elements, a drain of the set of non-volatile storage elements, and a gate of a selected non-volatile storage element in the set of non-volatile storage elements, a difference between the first and second voltages is based on the first bias level.

23. The non-volatile storage system of claim 22, wherein:
the first error metric is determined using error correction code decoding.

24. The non-volatile storage system of claim 22, wherein:
the first error metric is determined using error detection code decoding but not error correction code decoding.

25. The non-volatile storage system of claim 22, wherein:
the non-volatile storage elements store multi-bit data.

26. The non-volatile storage system of claim 22, wherein:
the set of non-volatile storage elements is provided in at least one NAND string which is in communication with a set of word lines, the source comprises a source end of the at least one NAND string, the drain comprises a drain end of the at least one NAND string, and the gate communicates with a selected word line of the set of word lines.

* * * * *